(12) United States Patent
Jensen et al.

(10) Patent No.: US 7,698,590 B2
(45) Date of Patent: Apr. 13, 2010

(54) METHOD AND APPARATUS FOR TIMING AND EVENT PROCESSING IN WIRELESS SYSTEMS

(75) Inventors: Poul R. Jensen, Arden (DK); Thorkild Leth Moller, legal representative, Arden (DK); Morten Nielsen, Hjallerup (DK); Mogens Christiansen, Hjoerring (DK)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 11/985,374

(22) Filed: Nov. 15, 2007

(65) Prior Publication Data

US 2008/0077770 A1    Mar. 27, 2008

Related U.S. Application Data

(62) Division of application No. 10/230,669, filed on Aug. 29, 2002, now Pat. No. 7,315,956.

(60) Provisional application No. 60/315,655, filed on Aug. 29, 2001.

(51) Int. Cl.
*G06F 1/14* (2006.01)
(52) U.S. Cl. .................. 713/500; 713/400; 713/600
(58) Field of Classification Search .............. 713/400, 713/500, 600
See application file for complete search history.

(56) References Cited

U.S. PATENT DOCUMENTS

| | | |
|---|---|---|
| 5,038,117 A | 8/1991 | Miller |
| 5,159,205 A | 10/1992 | Gorecki et al. |
| 5,560,024 A | 9/1996 | Harper et al. |
| 5,592,173 A | 1/1997 | Lau et al. |
| 5,842,037 A | 11/1998 | Haartsen |
| 5,987,339 A | 11/1999 | Asano |
| 6,170,051 B1 * | 1/2001 | Dowling ............. 712/225 |
| 6,255,882 B1 | 7/2001 | Hirai |
| 6,421,214 B1 | 7/2002 | Packard et al. |
| 6,659,948 B2 | 12/2003 | Lebel et al. |
| 6,763,448 B1 | 7/2004 | Mitsuishi |
| 6,907,514 B2 | 6/2005 | Mitsuishi |
| 2001/0027096 A1 * | 10/2001 | Lindlar ............. 455/343 |
| 2002/0083241 A1 | 6/2002 | Moller |

(Continued)

FOREIGN PATENT DOCUMENTS

EP    0 851 593    7/1998

(Continued)

OTHER PUBLICATIONS

C. Nguten, "Designing Low Voltage Microcontrollers into Portable Products", WESCON/97, Conference Proceedings Santa Clara, CA, Nov. 4-6, 1997, New York, NY, IEEE, pp. 222-227.

*Primary Examiner*—Tse Chen
(74) *Attorney, Agent, or Firm*—Fish & Richardson P.C.

(57) ABSTRACT

A digital baseband processor is provided for concurrent operation with different wireless systems. The digital baseband processor includes a digital signal processor for executing digital signal processor instructions, a microcontroller for executing microcontroller instructions, and a timing and event processor controlled by the digital signal processor and the microcontroller for executing timing-sensitive instructions. The timing and event processor includes a plurality of instruction sequencers for executing timing-sensitive instruction threads and a time base generator for generating timing signals for initiating execution of the instruction threads on each of the plurality of instruction sequencers.

22 Claims, 24 Drawing Sheets

U.S. PATENT DOCUMENTS

2002/0138778 A1* 9/2002 Cole et al. .................. 713/330
2003/0126487 A1 7/2003 Soerensen et al.

FOREIGN PATENT DOCUMENTS

| EP | 97309449.3 | 7/1998 |
| EP | 0 924 947 | 6/1999 |
| EP | 0 939 495 A1 | 9/1999 |
| GB | 2350754 | 12/2000 |

* cited by examiner

| FIG. 6A |
|---|
| FIG. 6B |

MCU Sleep Clock Requirements Register (MSCRR)
[0]  −DCLK,   1 = Must be active during MCU sleep
[1]  −DSCLK,  1 = Must be active during MCU sleep
[2]  −BCLK,   1 = Must be active during MCU sleep
[3]  −Allow PLL Bypass during sleep.

MCU Active Clock Requirements Register (MACRR)
[0]  −DCLK    1 = Active during MCU active
[1]  −DSCLK   1 = Must be active during MCU active
[2]  −BCLK    This bit is a forced one in this register
[3]  −Allow PLL Bypass. This bit is a forced zero in this register DSP Sleep Clock Requirement Register (DSCRR)
[0]  −DCLK,   1 = Must be active during DSP sleep
[1]  −DSCLK,  1 = Must be active during DSP sleep
[2]  −BCLK,   1 = Must be active during DSP sleep
[3]  −Allow Bypass during sleep DSP Active Clock Requirement Register (DACRR)
[0]  −DCLK    This bit is a forced one in this register
[1]  −DSCLK   This bit is a forced one in this register
[2]  −BCLK    This bit is a forced one in this register
[3]  −Allow PLL Bypass. This is a forced zero in this register.

FIG. 14B

METHOD AND APPARATUS FOR TIMING AND EVENT PROCESSING IN WIRELESS SYSTEMS

CROSS REFERENCE TO RELATED APPLICATIONS

This application is a divisional of pending application Ser. No. 10/230,669, filed Aug. 29, 2002, which claims the benefit of provisional application Ser. No. 60/315,655, filed Aug. 29, 2001, which are hereby incorporated by reference in their entirety.

FIELD OF THE INVENTION

The present invention relates to wireless communications and, more particularly, to timing and event processing in wireless systems.

BACKGROUND OF THE INVENTION

With the rapid advances in wireless communication networks, new wireless communication standards are often created to replace older obsolete standards. However, it often takes time to implement a new wireless network based on a new standard over a large physical area. Thus, it is often desirable to have a wireless terminal which can communicate with existing wireless networks as well as new wireless networks. Moreover, with the rapid growth of wireless computer data networks, it is often desirable to have a wireless terminal which can communicate with these networks to allow a user to browse the Internet or send and receive e-mail. Additionally, it may be useful to communicate with different wireless systems concurrently, so that a user may, for example, check e-mail on a wireless data network, while conducting a voice telephone call on a 2G wireless network.

Such wireless systems often use different time bases. For example, 2G GSM network uses a time base where frames have a duration of 4.615 milliseconds and are divided into 8 time slots. However, 3G WCDMA networks use a time base where frames have a duration of 10 milliseconds and are divided into 15 time slots. Events in the mobile terminal must be precisely timed and synchronized with respect to each of the wireless systems, regardless of whether the mobile terminal operates with one wireless system or operates concurrently two or more wireless systems.

Also, to maintain portability, wireless terminals are typically powered by batteries, where the time between recharges is an inverse function of the current drawn. Because it is desirable to allow the user to operate the wireless terminal for as long as possible between recharges, power management is an important consideration.

SUMMARY OF THE INVENTION

According to a first aspect of the invention, a digital baseband processor is provided. The digital baseband processor comprises at least one main processor for executing instructions in a first instruction sequence, and a timing and event processor coupled to the main processor for executing timing-sensitive instructions in a second instruction sequence. The timing and event processor comprises two or more instruction sequencers for executing threads of the second instruction sequence and a time base generator for generating timing signals for initiating execution of instructions on each of the two or more instruction sequencers.

According to another aspect of the invention, a digital baseband processor is provided for concurrent operation with different wireless systems. The digital baseband processor comprises a digital signal processor for executing digital signal processor instructions, a microcontroller for executing microcontroller instructions, and a timing and event processor controlled by the digital signal processor and the microcontroller for executing timing-sensitive instructions. The timing and event processor comprises a plurality of instruction sequencers for executing timing-sensitive instruction threads and a time base generator for generating timing signals for initiating execution of the instruction threads on each of the plurality of instruction sequencers.

According to a further aspect of the invention, a method is provided for generating timing signals for operating a wireless terminal in a wireless system having a wireless system time base. The method comprises generating a calibrated slow clock, generating absolute time values by counting the calibrated slow clock to provide a unified time base, and timing events in the wireless system based on the absolute time values of the unified time base independent of the wireless system time base.

According to another aspect of the invention, a method is provided for generating a calibrated clock. The method comprises receiving a free-running fast clock, receiving a free-running slow clock, modifying the free-running slow clock to provide a calibrated slow clock having a specified relationship to the fast clock, and providing a phase compensation signal that represents a phase error in the calibrated slow clock.

According to another aspect of the invention, a method is provided for generating a calibrated clock. The method comprises receiving a free-running fast clock, receiving a free-running slow clock, specifying a relationship between the fast clock and a calibrated slow clock, counting the number of fast clock cycles in a selected number of free-running slow clock cycles to provide a comparison value, removing cycles from the free-running slow clock to provide the calibrated slow clock, based on the specified relationship between the fast clock and the calibrated slow clock, and on the comparison value, and providing a phase compensation signal that represents a phase error in the calibrated slow clock.

According to another aspect of the invention, a method is provided for performing DMA transfers in a baseband communications processor. The method comprises performing computations in a digital signal processor core, generating timing signals in a timing and event processor, and performing a DMA transfer in response to a request from the digital signal processor and in response to the timing signals from the timing and event processor to provide a timed DMA transfer.

According to a further aspect of the invention, a baseband processor is provided for wireless applications. The baseband processor comprises a digital signal processor core for performing digital signal computations, a timing and event processor coupled to the digital signal processor core for executing timing-sensitive operations, the timing and event processor comprising a time base generator for generating timing signals and a DMA control circuit for initiating a DMA request in response to a command from the digital signal processor core and the timing signals from the time base generator, and a DMA controller for executing the DMA request to provide a timed DMA transfer.

BRIEF DESCRIPTION OF THE DRAWINGS

In the drawings:

FIG. 14B is a table illustrating the contents of the registers shown in FIG. 14A, according to one embodiment of the invention.

DETAILED DESCRIPTION

A wireless terminal may include a radio unit, a digital baseband processor, a user interface and a battery. The baseband processor may include a digital signal processor for executing signal processing algorithms and other complex computations, and a microcontroller for performing control functions and relatively simple computations. Many of the tasks performed by baseband processors in wireless terminals require precise timing. For example, in a wireless communications network, actions on a wireless channel are scheduled to happen at given times, with a specified precision. A dedicated timing and event processor (TEP) may be used to achieve such timing precision. For example, the TEP may be responsible for generating timing signals, scheduling events, generating interrupts to processors, initiating operations in other modules, and generating control signals for off-chip circuits, such as the radio unit. The TEP may operate in conjunction with the digital signal processor, the microcontroller and other components of the baseband processor to control all timing and events in the wireless terminal.

Sometimes it is desirable to communicate with several different wireless systems concurrently. For example, the communications processor may communicate with a wireless data network, such as a Bluetooth network, to monitor a user's e-mail account for new e-mail while simultaneously monitoring the paging channel of a wireless CDMA network for new voice telephone calls. Often, the different wireless systems with which the communications processor is communicating utilize different time bases. The TEP may schedule events for wireless systems by using a common reference clock as the time base for scheduling events for any of the wireless systems with which the communications processor is communicating.

Figure 1A:
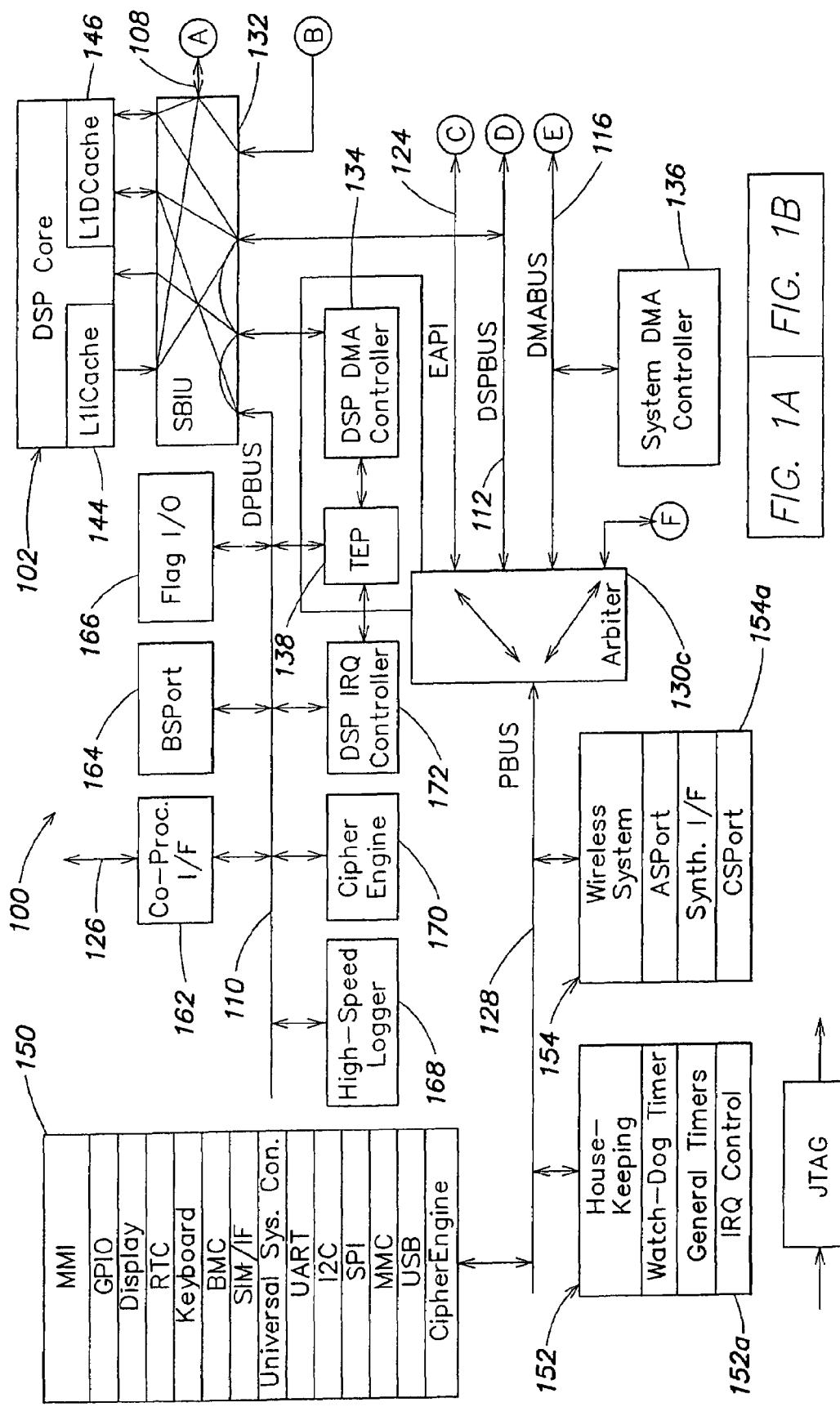
FIG. 1 is a block diagram of communications processor, according to one embodiment of the invention.
Figure 1B:
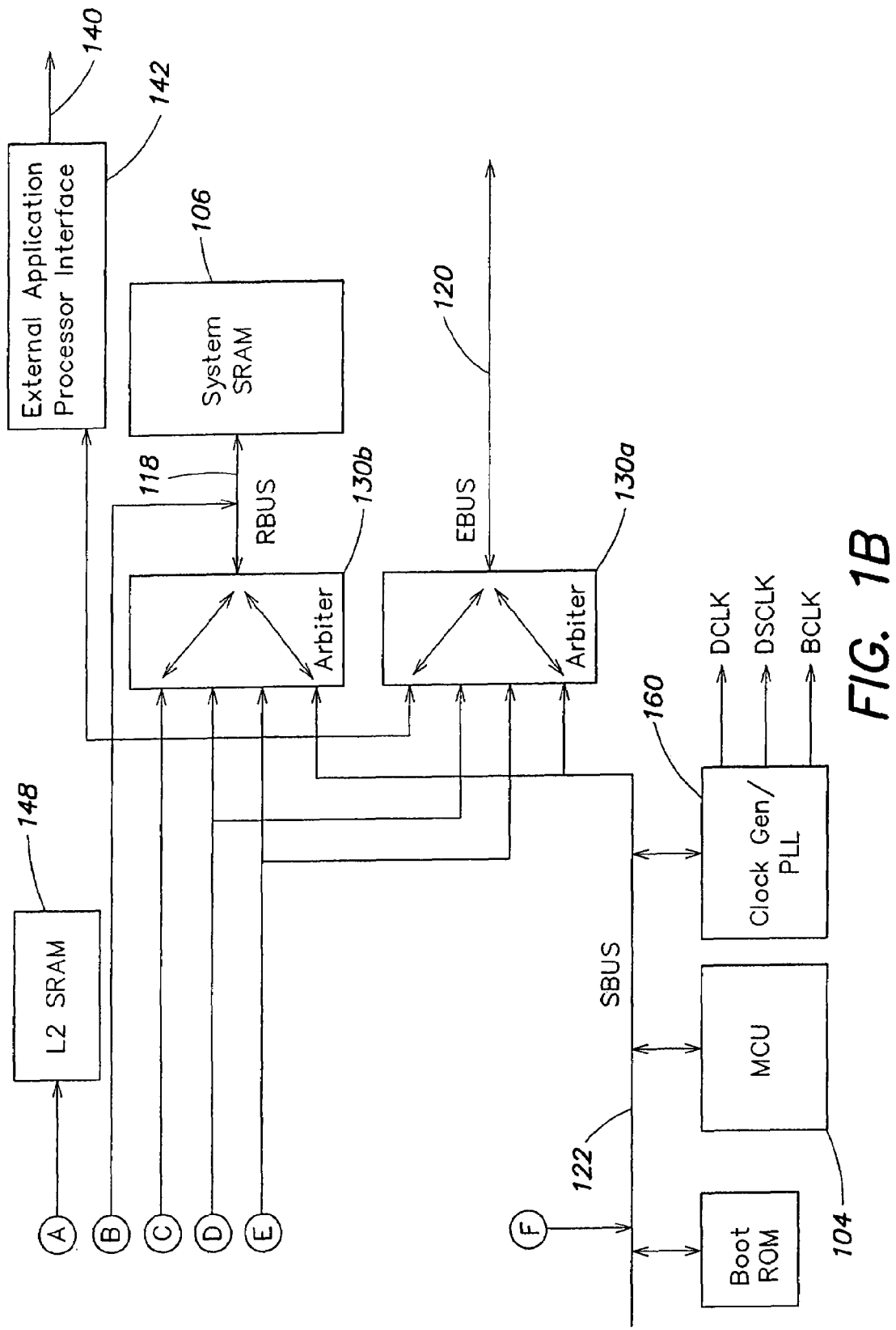

A block diagram of a baseband communications processor 100 according to one embodiment of the invention is illustrated in FIG. 1. The processor illustrated in FIG. 1 includes two processing cores. A Digital Signal Processor (DSP) core 102 may be used to perform digital signal processing functions of communication processor 100, such as processing associated with cell search, correlation of signals, and channel encoding and decoding. Many other signal processing functions may be performed by DSP core 102. An example of a DSP core suitable for use in the present embodiment is disclosed in PCT Publication No. WO 00/687783, published Nov. 16, 2000. However, it should be understood that many other types of digital signal processors may be used, and the invention is not limited to any particular digital signal processor. A Microcontroller Unit (MCU) 104 processing core may be used to execute control code for communications processor 100, such as execution of protocol stack instructions. An example of a commercially available MCU suitable for use in the present invention is the ARM7TDMI core, sold by Advanced RISC Machines, Ltd. However, it should be understood that many other types of microcontrollers may be used, and the invention is not limited to any particular microcontroller.

Communications processor 100 also includes a system memory 106. System memory 106 may be a static random access memory (SRAM), or any other type of volatile or non-volatile memory, such as dynamic random access memory (DRAM), synchronous dynamic random access memory (SDRAM) or ferroelectric random access memory (FRAM). DSP core 102 and MCU 104 utilize a common memory map. Therefore, these processors may share access to system memory 106 and may communicate with each other through system memory 106.

Each of the components illustrated in FIG. 1 may be implemented as a single integrated circuit or as multiple integrated circuits. In some embodiments, the entire communications processor 100 is fabricated on a single chip. It should be appreciated that the invention is not limited in this respect.

Direct Memory Access (DMA) controllers 134 and 136 are provided to facilitate data transfer in communications processor 100. DMA controllers 134 and 136 allow direct transfer of memory between devices and memory (e.g., system memory 106), without processor intervention. DMA channels may be assigned to devices to allow those devices to request DMA transfers. The channel configuration may be determined by DSP core 102 and MCU 104. Although both processors may access each DMA channel, the channel configuration for one group of channels may be controlled by DSP core 102 and the channel configuration for another group of channels may be controlled by MCU core 104. Likewise, DMA controller 134 may control DMA transfers for channels configured by DSP core 102, while DMA controller 136 may control DMA transfers for channels configured by MCU 104.

DSP core 102 may include a Level 1 (L1) instruction cache 144 and a L1 data cache 146 to provide low latency when accessing cached data. DSP core 102 may have two data buses connected to L1 data cache 146, an instruction bus connected to L1 instruction cache 144 and a DMA bus connected to caches 144 and 146. A Level 2 (L2) memory 148 may be dedicated SRAM for use by DSP core 102. Memory 148 may be accessible by DMA controller 134. Memory 148 may also be accessed by MCU 104, DMA controller 136, and External Application Processor Interface (EAPI) 142.

A System Bus Interface Unit (SBIU) 132 performs bus bridging functions. For example, SBIU 132 may function as an asymmetric crossbar switch which routes requests from DSP core 102, DMA controller 134, MCU 104, DMA controller 136, and External Applications Processor Interface 142 to appropriate system resources, such as L1 cache 144, L1 cache 146, L2 memory 148, and other system resources. SBIU 132 allows for parallel and concurrent data transfer between various buses.

Man-Machine Interface (MMI) modules 150 provide hardware user interfaces to communications processor 100 and are accessible through PBUS bus 128. MMI 150 modules may include an interface to General Purpose I/O (GPIO) pins of communications processor 100. Such pins may be used for various purposes, including interfacing to a radio unit and other external devices. Other MMI modules may include a display screen interface, a serial port interface, a universal asynchronous receiver transmitter interface (UART), a USB interface, and a subscriber identity module (SIM) which may contain a unique serial number of the wireless terminal in which communication processor 100 is embedded. Many other interface modules may be included in MMI 150.

Housekeeping modules perform various housekeeping functions for communications processor 152 and are accessible through PBUS bus 128. Such functions include a watchdog timer (WDT) which times out and generates a reset in the event of software deadlocks in the communications processor, if not served, general timers which may be used to generate triggers for general purpose timing functionality, and an IRQ controller for managing interrupts to DSP core 102 and MCU 104.

Wireless system modules 154 provide interfaces to wireless system components external to communications processor 100 and are accessible through PBUS bus 128. For example, wireless system modules 154 may include a CSport, which is a control serial port interface to an analog baseband chip, and an interface to a frequency synthesizer.

DSP peripherals perform various digital signal processing functions in conjunction with DSP core 102 and are accessible through DPBUS bus 110. DSP peripherals may include, for example, coprocessor interface 162, BSport 164, flag I/O 166, high-speed logger 168, cipher engine 170 and DSP IRQ controller 172.

Data may be transferred between various components of the communications processor and between the communications processor and off-chip devices using one or more buses. Each bus may be a parallel or a serial bus. Additionally, each bus may be unidirectional or bi-directional. Moreover, each bus may include any of an address bus, a data bus, and a control bus. The bus configuration of communications processor 100 illustrated in FIG. 1 includes multiple bus systems. The function of each bus system is described generally below. Many variations, modifications, and improvements to the bus configuration illustrated in FIG. 1 will occur to one skilled in the art and are included within the spirit and scope of the invention.

A SYSL2 bus 108 is coupled between SBIU 132 and interfaces to L2 memory 148. Memory 144 is shared between MCU 104, system DMA controller 136, DSP DMA controller 134, and DSP 102. A DPBUS bus 110 is the DSP peripheral bus and interfaces to various DSP peripherals, such as BSPort 164 which may be a baseband serial port, Co-processor interface 162, Flag I/O 166, High-Speed Logger 168, Cipher Engine 170, and DSP IRQ controller 172. Access to DPBUS bus 110 is shared between MCU 104, System DMA controller 136, and DSP DMA controller 134. DSP core 102 may also access DPBUS bus 110 through SBIU 132. A DSPBUS bus 112 is the interface for DSP core 102 to the PBUS bus 128, system memory 106, and EBUS bus 100. A DABUS bus 114 serves as the DSP DMA controller interface to SBIU 132. A DMABUS bus 116 is the interface between system DMA controller 136 and resources on PBUS bus 128, RBUS bus 118, and EBUS bus 120. An RBUS bus 118 is the interface to system memory 106. Access to RBUS bus 118 is shared between MCU 104, system DMA controller 136, DSP DMA controller 134, and DSP core 102. An EBUS bus 120 serves as an interface to FLASH memory and SRAM located external to communications processor 100. An SBUS bus 122 is the main system bus for MCU 104. An EAPI bus 124 serves as the interface to the resources of communications processor 100 from an applications processor external to communications processor 100. An EABUS bus 140 is the interface between EAPI 142 and an applications processor external to communications processor 100. It should be appreciated that it is not necessary to provide an external applications processor. A CBUS bus 126 is the interface to an external co-processor. The PBUS bus 128 is a peripheral bus, which interfaces wireless system peripherals 154, housekeeping peripherals 152, and MMI peripherals 150 to MCU 104, System DMA controller 136, DSP DMA controller 134, and DSP core 102.

Because access to some buses, such as PBUS bus 128 and RBUS bus 118, is shared by multiple components, bus arbiters 130*a*, 130*b* and 130*c* are provided to manage access to these buses.

Communications processor 100 includes a timing and event processor (TEP) 138 which may be used to schedule events for communications processor 100. Such events may include, for example, setting and clearing of I/O pins, generating interrupts to DSP core 102 and MCU 104, and initiating DMA memory transfers between TEP 138 and other modules of communications processor 100. The TEP 138 is connected to other modules of communications processor 100 via DPBUS bus 110 and is also connected to DSP DMA controller 134 and DSP IRQ controller 172.

In the TEP 138, different wireless system time bases are converted to a unified time base, which is not specific to any wireless system. Events are scheduled as triggers to an absolute point in time, using the unified time base. The TEP 138 generates a calibrated slow clock as the reference for the unified time base, by using a high precision free-running fast clock as a calibration reference to obtain long-term stability of the calibrated slow clock. The calibrated slow clock, which is used as the clock to the unified time base, is generated by removing clock pulses from a free-running slow clock. This introduces a phase error, which is compensated in order to obtain precise timing signals. A phase compensation is calculated for every clock cycle of the free-running slow clock. The phase compensation is expressed as a number of clock cycles of the free-running fast clock and is used, together with the calibrated slow clock, to provide exact timing. A feature is that the phase compensation value is maintained even though the free-running fast clock is switched off. These features are discussed in detail below.

Figure 5:
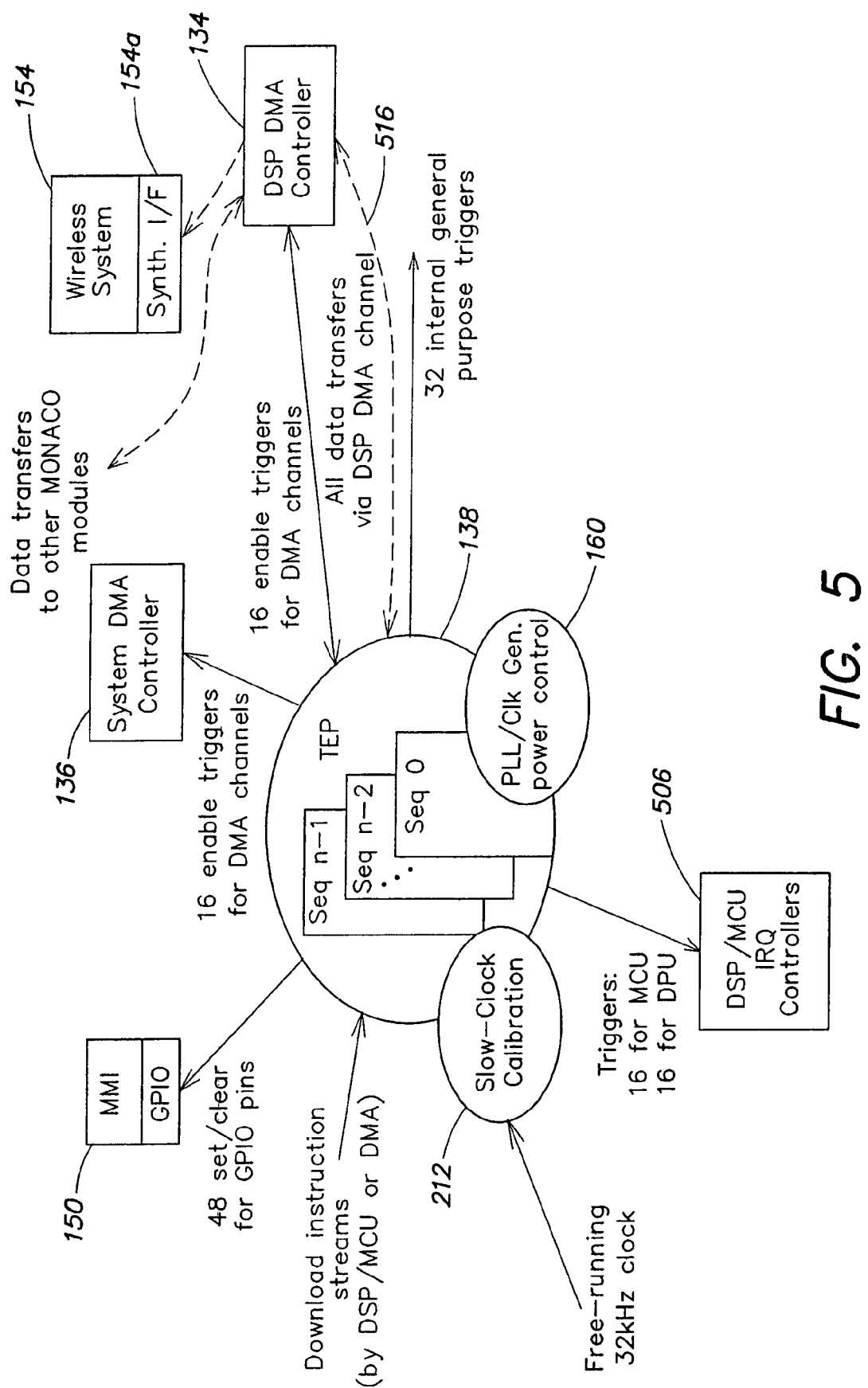
FIG. 5 is a diagram that illustrates the functions of the timing and event processor, according to one embodiment of the invention.

FIG. 5 is a schematic diagram that represents examples of the functions of TEP 138. TEP 138 can set and clear GPIO pins to control interfaces with external devices. TEP 138 may also communicate with system DMA controller 136 and DSP DMA controller 134 to enable DMA channels. Also, using a dedicated DMA channel 516, TEP 138 may read from and write to any memory-mapped location, allowing TEP 138 to communicate with other modules, such as wireless system 154, for example, to program the frequency synthesizer using frequency synthesizer interface 154*a*. TEP 138 may interface with the DSP and MCU IRQ controllers 506 to generate interrupts for each processing core, allowing the processing cores to enter idle states when not needed and to exit the idle states when necessary by receiving interrupts from TEP 138. All of the TEP functions may be precisely timed and scheduled as described below.

Figure 2A:
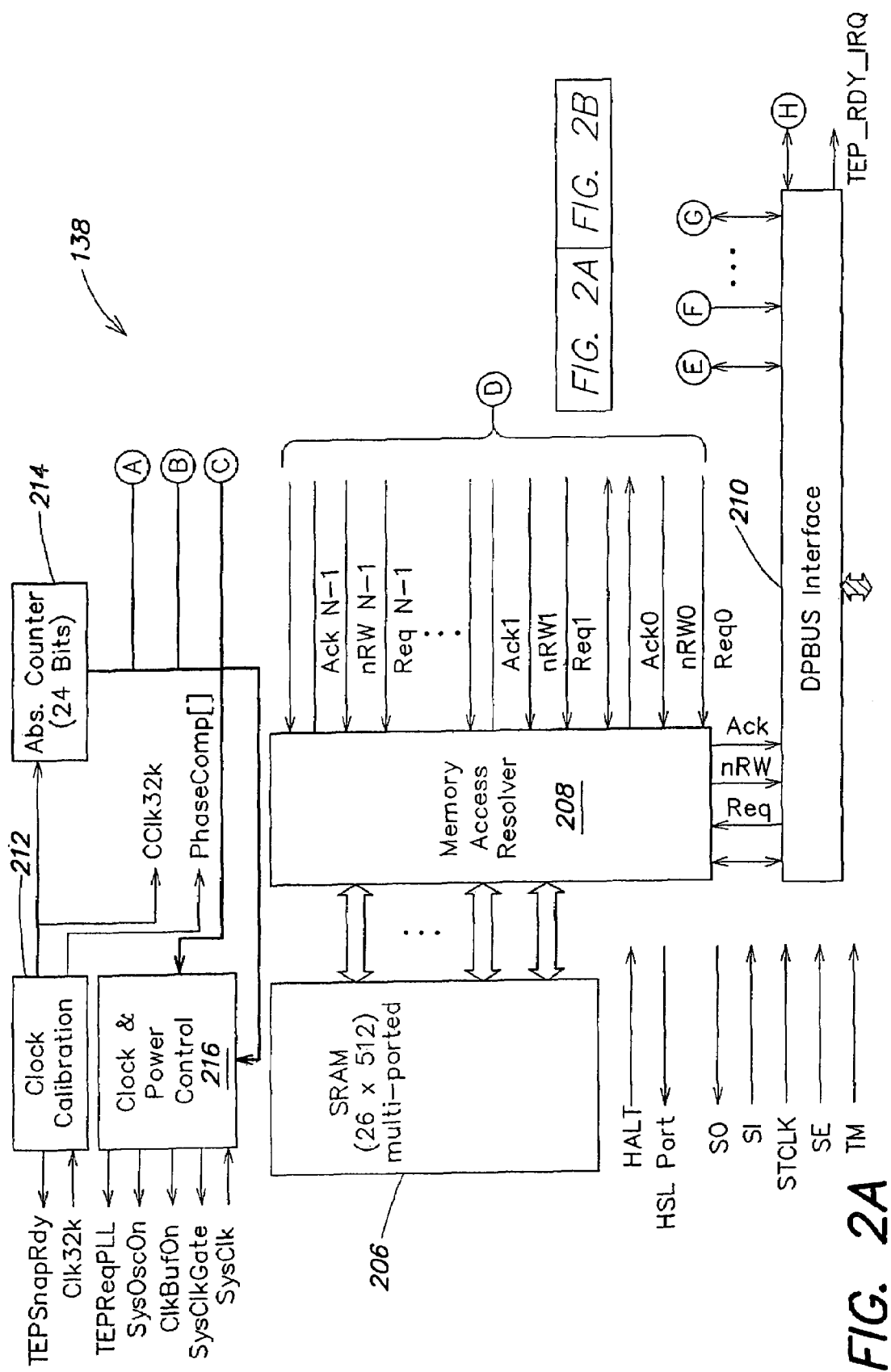
FIG. 2 is a block diagram of a timing and event processor in the communications processor of FIG. 1, according to one embodiment of the invention.
Figure 2B:
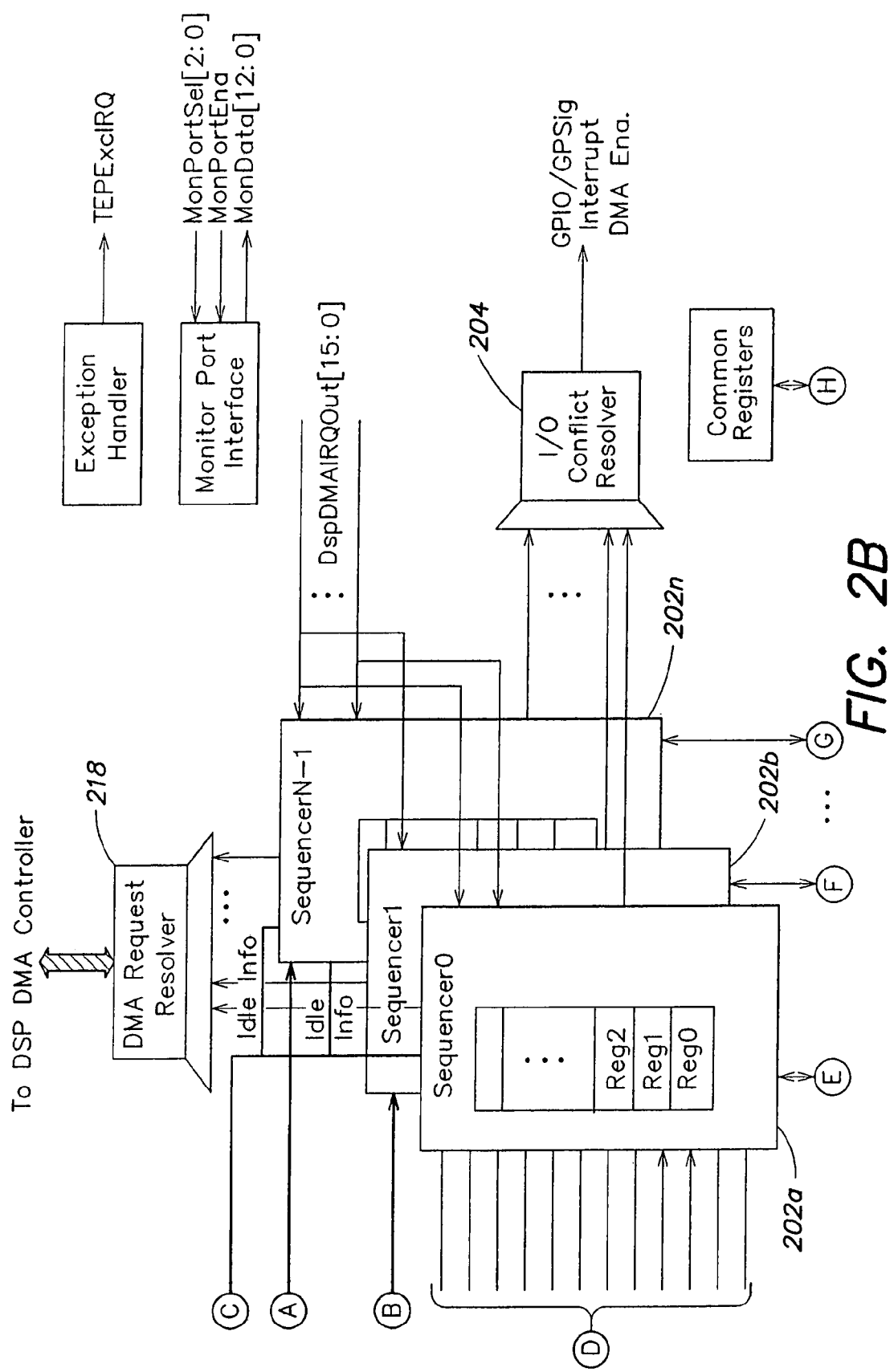

FIG. 2 is a block diagram of an example of TEP architecture 138 according to one embodiment of the invention. TEP 138 may serve as a timing and scheduling mechanism for communications processor 100. In the operation of a wireless system, all radio control events occur at scheduled times and require precise timing. At certain times during operation of communications processor 100, particularly in a wireless communications application, both MCU 104 and DSP core 102 may not be required to perform any processing functions and may go into an idle mode or "sleep" mode. In this mode, the processing cores no longer need to be clocked, thereby allowing the oscillator to be powered down. Communications processor 100 may be embedded in a wireless terminal and may be powered by a battery. Saving power by idling processors or powering down oscillators when not needed can extend the time before recharging of the battery is required. However, before the processing cores are idled, they may indicate to TEP 138 a time when it is necessary for them to be restarted.

TEP 138 may include a plurality of sequencers 202*a*-202*n* which function generally to execute instructions utilized by TEP 138 for performing time-specific actions. TEP 138 also includes a memory 206, which may be, for example, static random access memory (SRAM). Sequencers 202*a*-202*n* may use memory 206 to store code and data. A memory access resolver 208 processes incoming memory access requests from sequencers 202*a*-202*n* and DPBUS bus 110. A DPBUS bus interface module 210 provides bridging between the system clock and the DPBUS bus clock domains within TEP 138. DPBUS bus interface module 210 is described in more detail below. TEP 138 further includes a clock calibration block 212 which may be used for clock calibration of the unified time base in the TEP. Clock calibration block 212 is discussed in more detail below. TEP 138 may also include an absolute counter 214 which may be used by sequencers 202*a*-202*n* for timing purposes. Absolute counter 214 is discussed in greater detail below. TEP 138 may include an I/O conflict resolver 204 for resolving conflicting signals received from sequencers 202*a*-202*n*. I/O conflict resolver 204 is discussed in greater detail below. A Clock and Power control block 216, which is discussed in greater detail below, is used for powering down the system clock when possible.

Sequencers 202*a*-202*n* may be processors, such as RISC processors, with a dedicated instruction set and may provide timing for multiple wireless systems concurrently. That is, sequencers 202*a*-202*n* may generate signals to set and clear GPIO pins, signal DMA controllers, and generate interrupts for DSP core 102 and MCU 104. A sequencer may be provided to execute instructions for each wireless system to be supported concurrently. Improved performance may be obtained by providing two or more sequencers for each wireless system. For example, in one embodiment of the invention, two sequencers may be provided for each wireless system to be supported concurrently. In this configuration, one sequencer may execute instructions while the other sequencer is being loaded with instructions. It should be appreciated that a single sequencer is capable of supporting multiple wireless systems. A single sequencer may be loaded with instructions pertaining to two different wireless systems. However, true concurrency cannot be achieved using a single sequencer because a time of execution of an instruction pertaining to the first wireless system may overlap with a time of execution of another instruction pertaining to the second wireless system. Because these instructions are executed in a sequence by a single sequencer, they cannot execute concurrently. However, it should also be appreciated that is not necessary to use two sequencers for each wireless system. One sequencer per wireless system may be used, or three or more sequencers may be used for each wireless system. An additional sequencer unrelated to wireless system processing, may be used for providing general purpose timing. For example, the additional sequencer may be used to schedule timing events related to updating a clock on the display screen of the wireless terminal. In some embodiments, the TEP 138 includes two sequencers for each wireless system to be supported concurrently and one additional sequencer.

Using multiple sequencers allows communications processor 100 to communicate with several different wireless systems concurrently, despite the fact that the wireless systems use different timing. For example, a wireless terminal may monitor the paging channel of a GSM network while concurrently receiving data from a wireless LAN, a Bluetooth network, or other 802.11b network. Similarly, a wireless terminal with a communications processor having multiple sequencers, upon startup, may simultaneously perform cell search for both a 2G GSM network and a 3G WCDMA network.

As mentioned above, TEP 138 can set and clear GPIO pins, enable DMA channels, generate interrupts, and perform clock calibration. However, two or more sequencers may assert conflicting signals. For example, one sequencer may assert a set signal for a particular I/O pin, while a different sequencer asserts a clear signal for the same pin at the same time. I/O conflict resolver 204, shown in FIG. 2, handles such conflicts. I/O conflict resolver 204 contains rules which resolve conflicts. For example, one rule may be that any clear signal takes precedence over a set signal. An exception may be generated to notify the software process of the conflict, and an interrupt may be sent to the processing core. For interrupts and DMA channel enables, conflicting signals may simply be combined together, for example, using a logical OR operation.

Memory 206, shown in FIG. 2, may be accessible to the processors through DPBUS bus interface 210 which interfaces with DPBUS bus 110. According to one embodiment of the invention, memory 206 is 26-bits wide and is multi-ported to allow simultaneous access by sequencers 202*a*-202*n* and DPBUS bus 110. The number of read and write ports provided for memory 206 may be chosen based on the number of sequencers in TEP 138. For example, one read port and one write port may be provided for every sequencer. However, a large number of ports consumes area on the chip and may require an increased number of instruction decoders. Alternatively, one instruction decoder may be provided for each sequencer. Additionally, it is not likely that all of the sequencers will require memory access within the same clock cycle. Therefore, the number of read ports for memory 206 may be chosen based on the number of wireless systems concurrently supported. For example, one read port may be provided for each wireless system supported. Because write accesses occur less frequently than read accesses, fewer write ports than read ports may be provided. The number of ports for memory 206 may be selected based on any criteria, and the invention is not limited to any particular number of ports for memory 206.

As mentioned above, Memory access resolver 208 processes incoming access requests to memory 206 from sequencers 202a-202n and DPBUS bus 110. Memory access resolver 208 also handles conflicts, for example, in the case of more access requests than read ports. Memory access resolver 208 may handle such situations by prioritizing requests based on a round-robin scheme, for example. In such a round-robin scheme, a shift-back register may be used to determine priority. In one embodiment, when a conflict for memory access occurs, the register is shifted. In another embodiment, the shift-back register may be shifted upon every memory access by any sequencer. However, it should be appreciated that many other methods of handling request conflicts may be used.

DPBUS bus interface module 210 provides bridging between the system clock and the DPBUS bus clock domains within TEP 138. DPBUS interface module 210 also handles the 16/32 bit interfacing between the DPBUS bus 110 and the internal TEP bus.

Figure 8A:
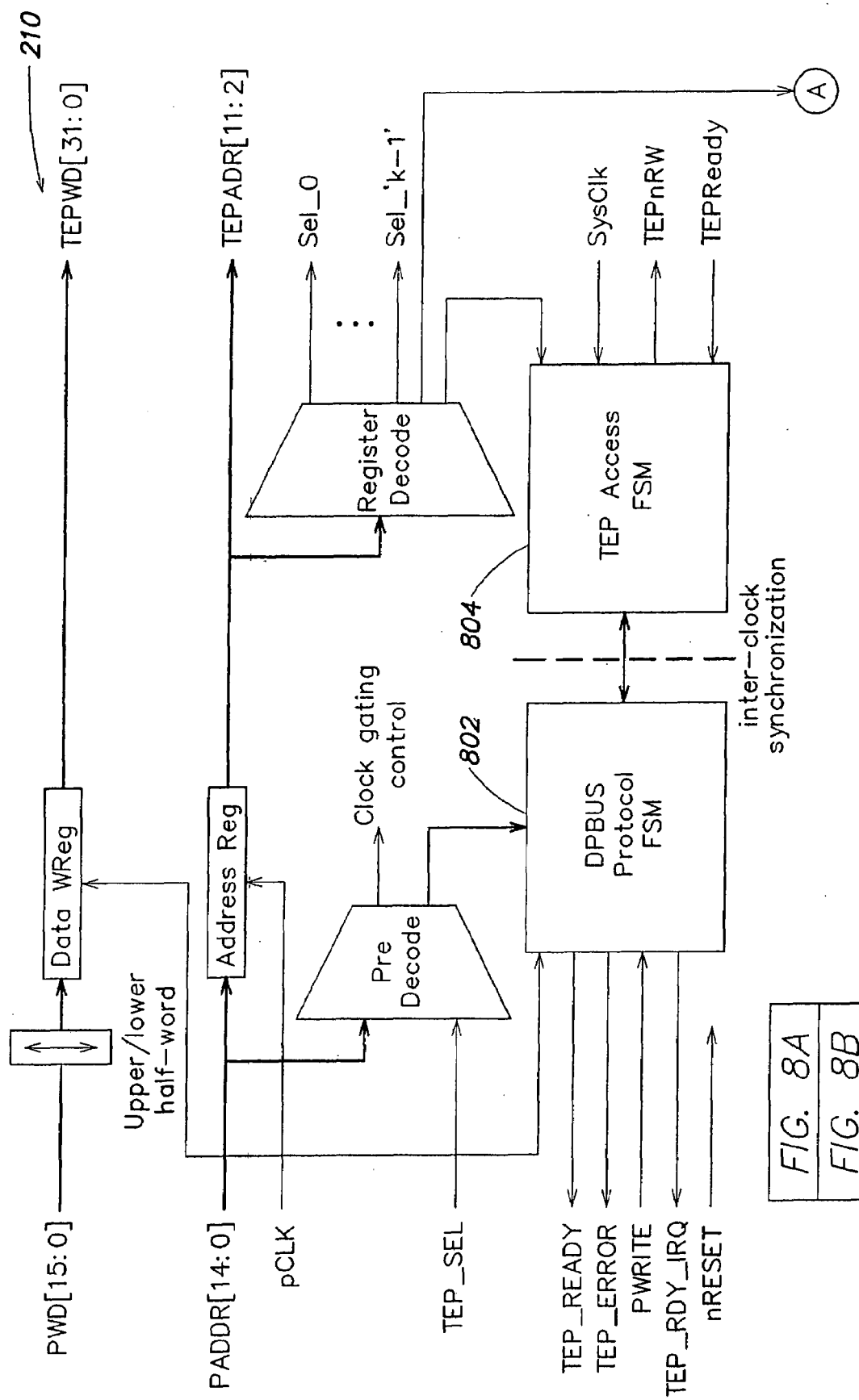
FIG. 8 is a block diagram of an external bus interface with the timing and event processor, according to one embodiment of the invention.
Figure 8B:
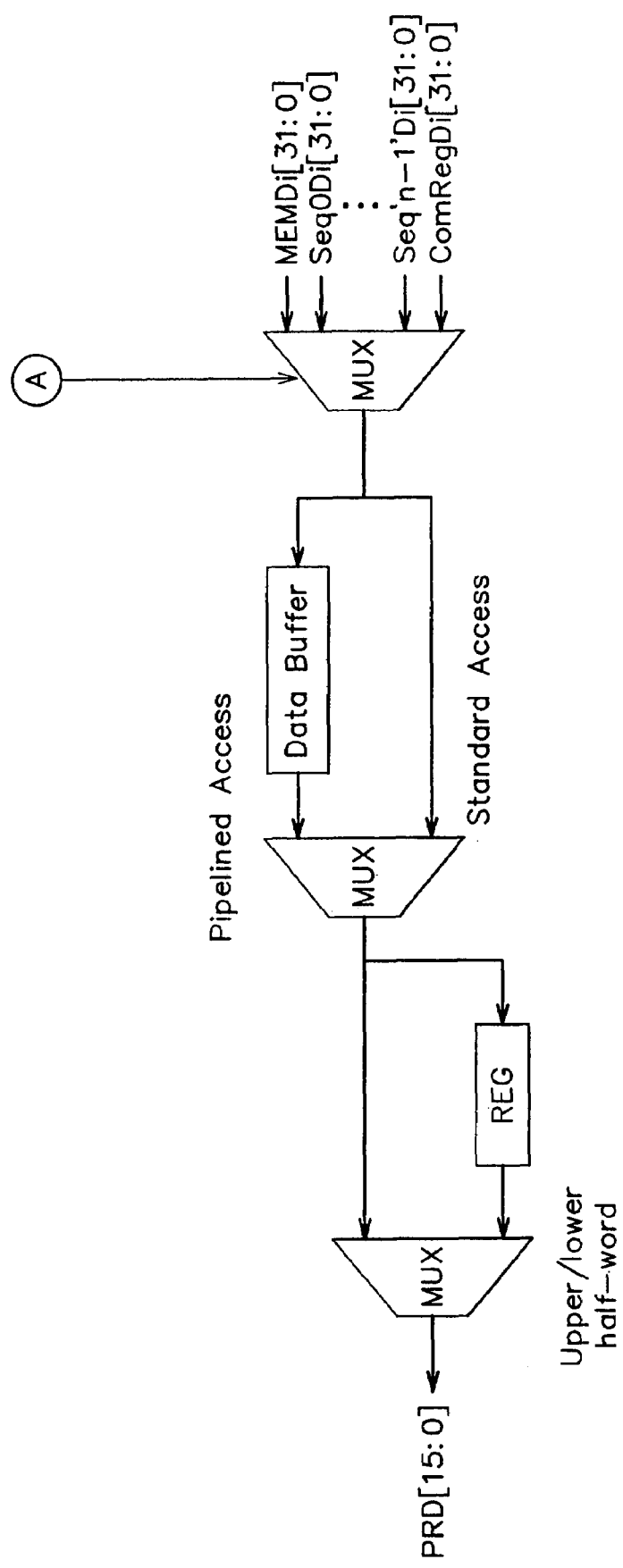

A block diagram of DPBUS bus interface module 210 according to one embodiment of the invention is shown in FIG. 8. As mentioned above, DPBUS bus interface 210 performs inter-clock synchronization between the DPBUS bus clock and the system clock. Each clock domain may be controlled separately, using handshaking signals for inter-synchronization. DPBUS protocol FSM 802 handles the handshaking signals to the DPBUS. TEP access FSM 804 handles the handshaking signals to the internal TEP bus.

Figure 3A:
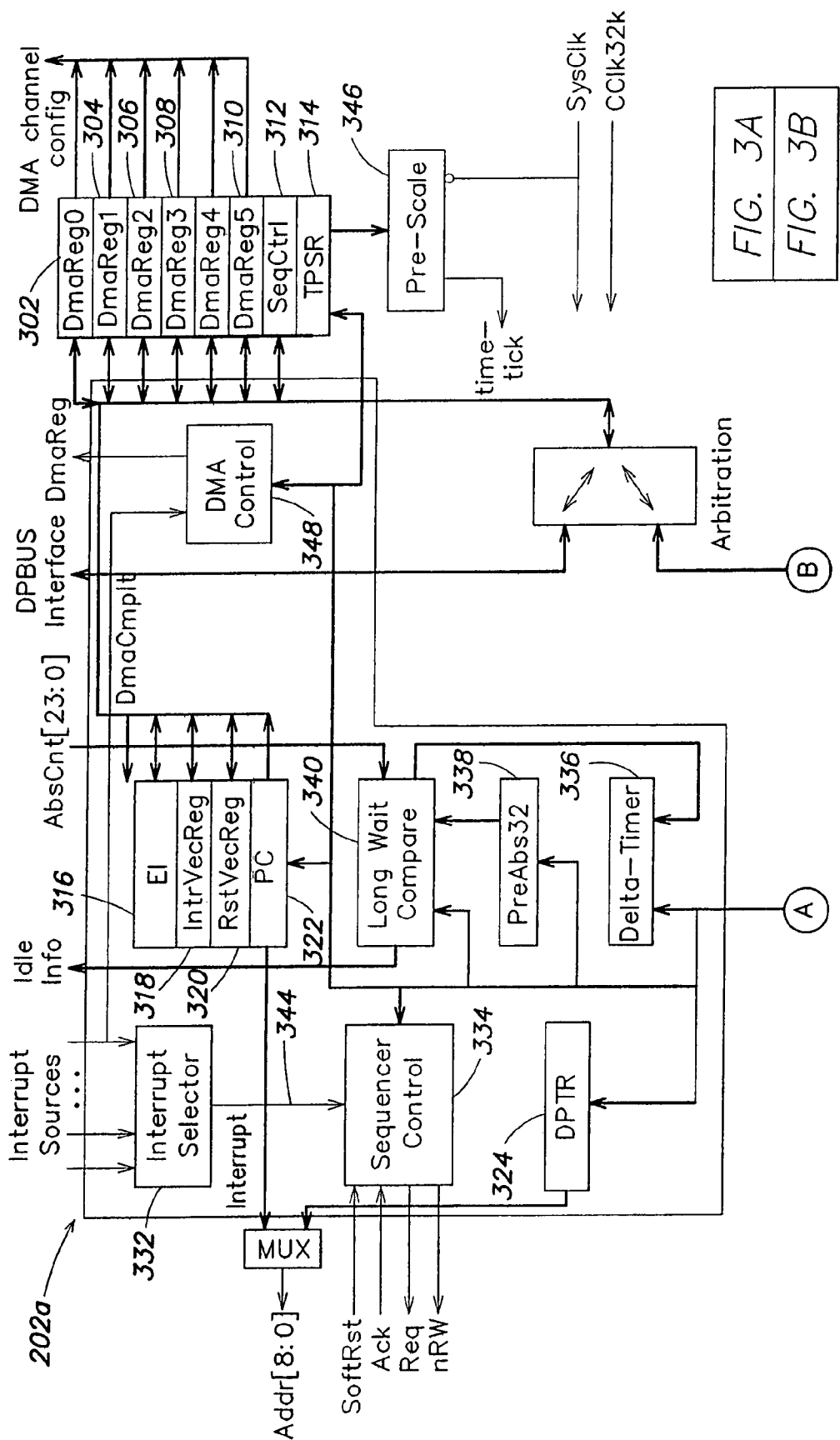
FIG. 3 is a block diagram of a sequencer in the timing and event processor of FIG. 2, according to one embodiment of the invention.
Figure 3B:
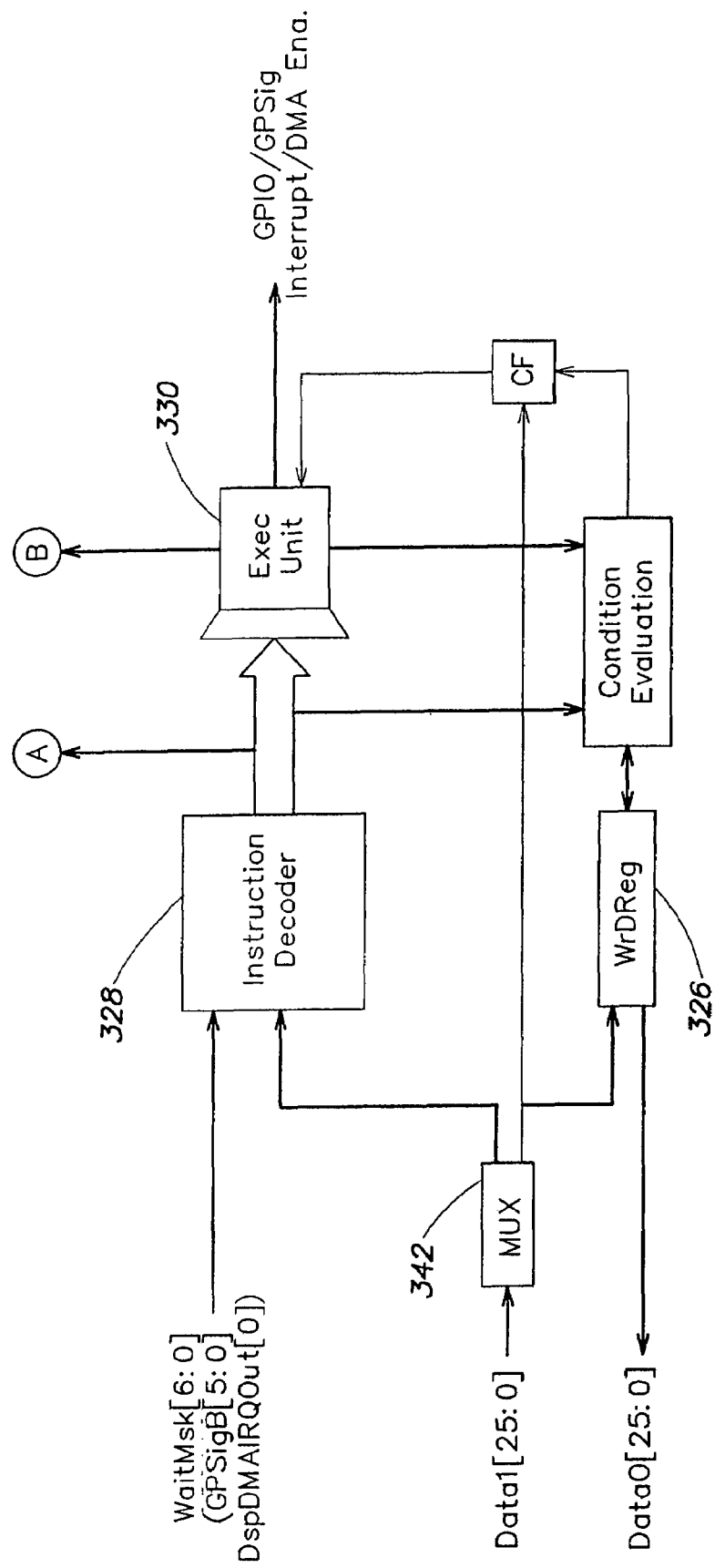

FIG. 3 is a block diagram that illustrates an example of sequencer 202a architecture according to an embodiment of the invention. Sequencer 202a may be a pipelined processor including fetch, decode, and execute stages. An instruction decoder 328 decodes instructions received from a multiplexer 342. The instructions are fetched from memory 206 of TEP 138. Sequencer instructions may be loaded into memory 206 of TEP 138 under control of DSP core 102 and MCU 104. The multiplexer 342 may direct data associated with instructions to a register 326. The data stored in register 326 may be data to be written in a write or modify operation or may be data retrieved from a read operation. Sequencer 202a may further include a DMA control module 348 for interfacing with DMA controller 134 and DMA controller 136. Sequencer 202a may include a plurality of DMA registers (e.g., 302, 304, 306, 308, 310) which are used to configure DMA channels. Sequencer 202a may include a clock pre-scale module 346 which is used to generate a time tick to increment a delta timer 336. A sequencer control module 334 handles the overall operation of the sequencer and is discussed in greater detail below.

Figure 4:
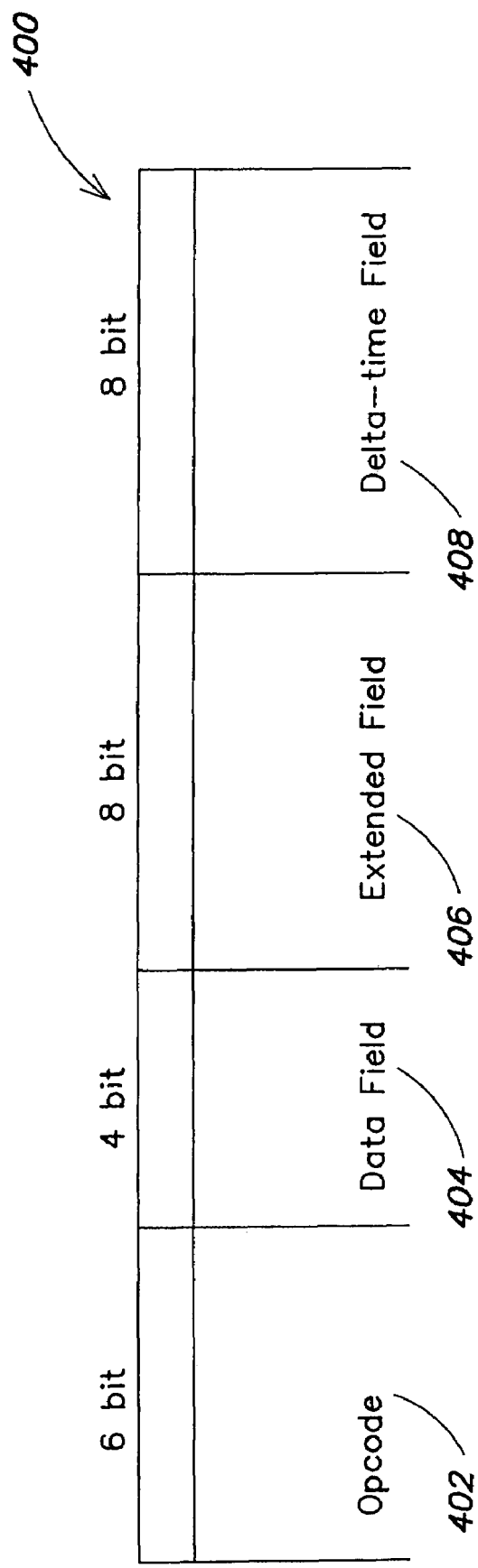
FIG. 4 is an example of an instruction format suitable use in a sequencer, according to one embodiment of the invention.

FIG. 4 illustrates an example of a format of an instruction which may be executed by sequencers 202a-202n. Instruction 400 includes a six-bit opcode field 402 which identifies the instruction type. A four-bit data field 404 may include data needed to process the instruction. For example, an instruction to set a General Purpose I/O (GPIO) pin may include a data field which identifies a GPIO pin to be set. An extended field 406 may optionally be used as an eight-bit extension to data field 404. If the data associated with the instruction is too large for the four-bit data field, extension field 406 may be used to hold the overflow. A delta-time field 408 may be used to indicate a time delay before the instruction is to be executed. Delta-time field 408 may indicate a time to wait after execution of the previous instruction and before execution of the current instruction (i.e., instruction 400).

After an instruction is decoded by instruction decoder 328, delta-timer 336, shown in FIG. 3, may be used to time the wait period indicated in the delta-time field of the instruction. When the time delay reaches the time in delta-timer 336, the instruction may be executed by execution unit 330. Execution of instructions based on delta-times may allow the sequencers to perform time-dependent functions, that is, functions which are scheduled to occur at particular times. For example, the sequencers can generate timed interrupts to the processing cores 102 and 104 (FIG. 1) to allow the processors to enter idle states when not being used and can generate timed interrupts to exit these idle states at the appropriate times. Sequencer instructions may control the setting of pins for controlling external devices and may power up or power down the radio unit. Sequencer instructions may also enable DMA channels at specific times.

The clock pre-scale module 346, shown in FIG. 3, is used to generate a time-tick for incrementing delta-timer 336. Clock pre-scale module 346 performs a clock division of the system clock to generate the time-tick. In order to save power, it is desirable to use as low a frequency as possible, while still providing sufficient timing accuracy for operation with the wireless system. Because the clock frequency depends on the timing of the wireless system, Clock pre-scale module 346 can divide the system clock by any pre-scale value between two and sixty-four. The pre-scale value may be stored in a register 314.

An example of a sequencer instruction set in accordance with one embodiment of the invention is given in Table 1.

TABLE 1

| Opcode | Instruction (6 bits) | Data Field (4 bits) | Extension Field (8 bits) | Delta-Time (8 bits) | Description |
| --- | --- | --- | --- | --- | --- |
| 0x00 | Clr GPIOA | Select Pin | Not Used | Delta-Time | Clears selected GPIOA pin, synchronized to GPSigA |
| 0x01 | Set GPIOA | Select Pin | Not Used | Delta-Time | Sets selected GPIOA pin, synchronized to GPSigA |

TABLE 1-continued

| Opcode | Instruction (6 bits) | Data Field (4 bits) | Extension Field (8 bits) | Delta-Time (8 bits) | Description |
|---|---|---|---|---|---|
| 0x02 | Clr GPIOB | Select Pin | Not Used | Delta-Time | Clears selected GPIOB pin |
| 0x03 | Set GPIOB | Select Pin | Not Used | Delta-Time | Sets selected GPIOB pin |
| 0x04 | Clr GPIOC | Select Pin | Not Used | Delta-Time | Clears selected GPIOC pin |
| 0x05 | Set GPIOC | Select Pin | Not Used | Delta-Time | Sets selected GPIOC pin |
| 0x06 | Toggle GPSigA | Select Signal | Not Used | Delta-Time | Generates pulse at selected GPSigA line |
| 0x07 | Toggle GPSigB | Select Signal | Not Used | Delta-Time | Generates pulse at selected GPSigB line |
| 0x08 | Toggle ARMInt | Select Signal | Not Used | Delta-Time | Generates pulse at selected MCU interrupt line |
| 0x09 | Toggle DSPInt | Select Signal | Not Used | Delta-Time | Generates pulse at selected DSP interrupt line |
| 0x0A | Toggle DMAInt | Select Channel | Not Used | Delta-Time | Generates pulse at selected Sys. DMA enable line which enables associated DMA channel |
| 0x0B | Toggle DSPDMA Int | Select Channel | Not Used | Delta-Time | Generates pulse at selected DSP. DMA enable line which enables associated DMA channel |
| 0x0C | Short Wait | Not Used | 4 bits Not Used 4 bits Wait | Wait | Waits for <Wait> time-ticks |
| 0x3x | | LongWait (2 bits) | Absolute Time (24 bits) | | Waits until <Abs. Time> arrives plus 3-4 SysClk cycles additional delay before starting the next instruction. The instruction implicitly implements the calibration phase compensation |
| 0x10 | If . . . Skip Next | | Address (12 bits) | Bit | Tests the <Bit> at <Address> of internal TEP memory, and, if set, the next instruction will be substituted by a NOP with same execution delay |
| 0x11 | ClrBit | | Address (12 bits) | Bit | Clears the <Bit> at <Address> |
| 0x12 | SetBit | | Address (12 bits) | Bit | Sets the <Bit> at <Address> |
| 0x15 | Shift | | Address (12 bits) | Not Used | Left shifts the contents at <Address> one bit. |
| 0x0D | Wait | | Trigger Select, Bit 6: DSP DMA ch0 Bits 5-0: GPSigB[5:0] 6 bits not used | Not Used | Wait until selected trigger GPSigB[5:0] or the DSP DMA channel 0 |

TABLE 1-continued

| Opcode | Instruction (6 bits) | Data Field (4 bits) | Extension Field (8 bits) | Delta-Time (8 bits) | Description |
| --- | --- | --- | --- | --- | --- |
| | | | | | IRQOut has occurred. |
| 0x14 | NOP | | Not Used | | No operation |
| 0x0E | Jump | | Absolute Address | Not Used | Standard branch, jumps to <absolute address> |
| 0x0F | Die | | Not Used | | Stops execution and puts sequencer hardware into idle |
| 0x18 | WriteRegF | Reg. File Address | Write data (16 bits) | | Writes given data immediately to internal register of sequencer |
| 0x13 | DataMoveE | | Not Used | | Initiate DMA transfer, sing DMA setup stored in RegFile |

Sometimes it may be necessary to set or clear two or more I/O pins at the same time. Although the sequencer instruction set may provide instructions for setting or clearing I/O pins, such instructions are executed in sequence and not concurrently. To set or clear two or more pins at the same time, the set and clear instructions may be synchronized to a particular signal. For example, if pin GPIOA and pin GPIOB need to be set simultaneously, a sequencer may synchronize these instructions to GPSigA. Then, the sequencer may first execute the set GPIOA instruction followed by the set GPIOB instruction. These pins are not actually set until a toggle GPSigA instruction is executed, which causes both pins to be set simultaneously.

A LongWait compare module 340 is used when a Long-Wait instruction is executed by the sequencer. A LongWait instruction may be executed when no subsequent instructions are to be executed by the sequencer for a given amount of time. A LongWait instruction permits the system clock to be powered down and allows the sequencer to use a slow clock for timing, in order to save power.

LongWait compare module 340 compares the wait time indicated in the LongWait instruction with the value of absolute counter 214 (FIG. 2), which is discussed in greater detail below. The wait time may be a 24-bit value, thus requiring use of the eight-bit delta-time field, the eight-bit extended field, the four-bit data field, and four bits of the six-bit opcode field. LongWait compare module 340 receives an input from 24-bit absolute counter 214 and compares the value to the 24-bit wait time from the LongWait instruction. When the values match, the sequencer may execute the next instruction. Long-Wait Compare module 340 also outputs idle information which may be used by clock and power control block 216 of TEP 138 to determine if sequencers are executing LongWait instructions so that the system clock may be powered down when all sequencers are in an idle state.

A PreAbs32 register 338 is used to determine a time to power-up the oscillator if the oscillator has been shut down. The PreAbs 32 register indicates the absolute time point to power-up the oscillator which allows sufficient time for the oscillator to stabilize before the currently executing Long-Wait instruction completes and the next instruction begins execution.

The sequencer control module 334 controls program flow and handles interrupts for sequencers 202a-202n. Sequencer control module 334 requests instructions from memory based on the contents of a program counter register 322. Program counter register 322 holds the address of the next instruction to be executed. Sequencer control module 334 may receive interrupts over line 344 from interrupt selector 332, which may select the highest priority interrupt request from a plurality of interrupt sources. When an interrupt is received, the interrupt enable bit in a register 316 may be set and the address of the interrupt vector may be loaded into register 318. The sequencer jumps to address of the interrupt vector in register 318 and continues execution from there.

When a sequencer receives a hard reset or executes a Die instruction, the sequencer enters an idle state. A soft reset is used to instruct a sequencer to fetch a first instruction and begin executing instructions. When the sequencer receives a soft reset or an interrupt it may proceed with normal execution. If the sequencer receives a soft reset, the address to which the sequencer jumps to begin execution is held in a register 320. If the sequencer receives an interrupt, the address of the interrupt vector to which the sequencer jumps to begin execution is held in a register 318.

DMA registers 302, 304, 306, 308, and 310 are used by the sequencer to store DMA channel configuration information. For example, these DMA registers may store a source address, a destination address and a number of bytes to be transferred. DMA control module 348 interfaces with DSP-DMA controller 134 (FIG. 1) and system DMA controller 136 to initiate DMA transfers.

Figure 6A:
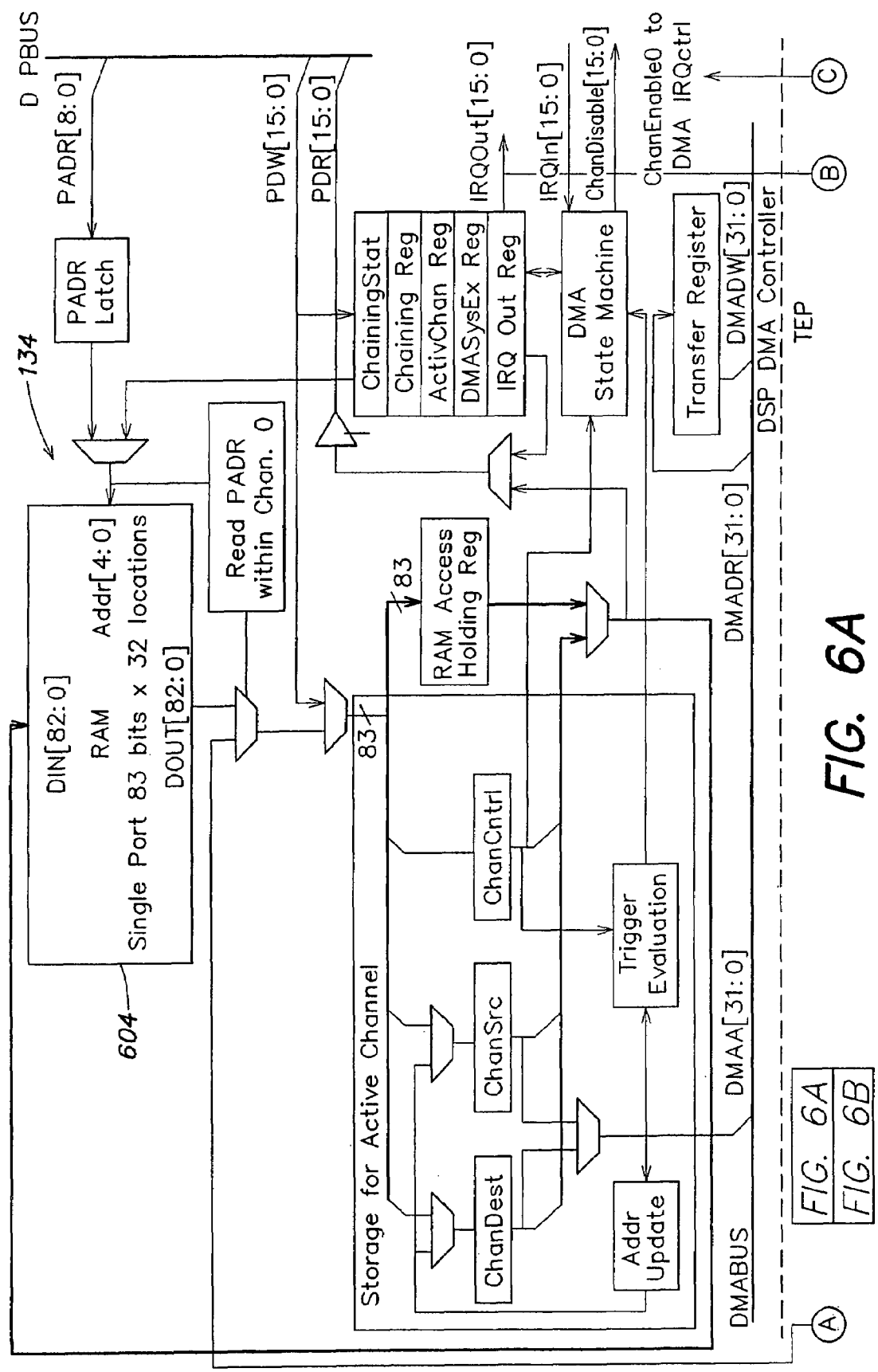
FIG. 6 is a block diagram of an interface between a direct memory access controller and the timing and event processor, according to one embodiment of the invention.
Figure 6B:
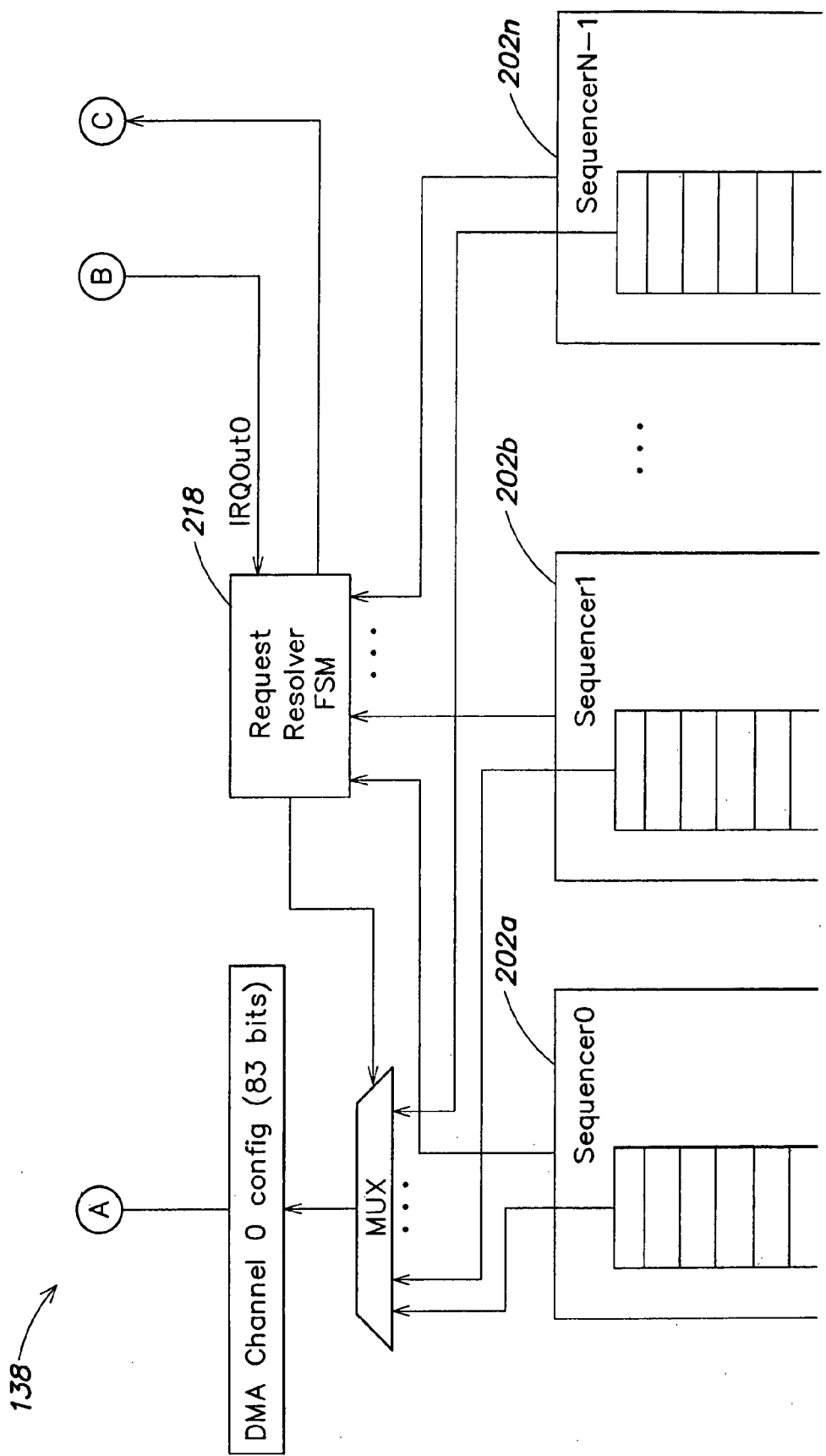

FIG. 6 illustrates an example of an interface between TEP 138 and DMA controller 134. One DMA channel may be dedicated for use by the TEP 138 and may not be used by other resources. For example, channel 0 may be allocated for TEP use, although any DMA channel may be used. Sequencers 202a-202n may initiate DMA transfers using the fixed channel by executing an instruction, for example the DataMoveE instruction, shown in the sequencer instruction set of Table 1. The DataMoveE instruction retrieves DMA channel configuration information from DMA registers 302, 304, 306, 308, and 310 and copies the information to an internal RAM 604 of DMA controller 134. Several sequencers may request access to the dedicated DMA channel simultaneously. Request resolver finite state machine (FSM) 218 handles these simultaneous requests. For example, request resolver FSM 218 may use a round-robin priority scheme to grant DMA channels access to the sequencers 202a-202n. When access is granted, the values of the DMA registers are copied to the memory 604 of the DMA controller, and request resolver FSM 218 sets a channel enable flag for enabling the dedicated DMA channel. When the DMA transfer is complete, DMA controller 134 returns an interrupt to request resolver FSM 218. Also, request resolver FSM 218, while in use, may assert a DRReqSysClk flag (not shown) to ensure that the system clock is not powered off during a DMA transfer.

Figure 7:
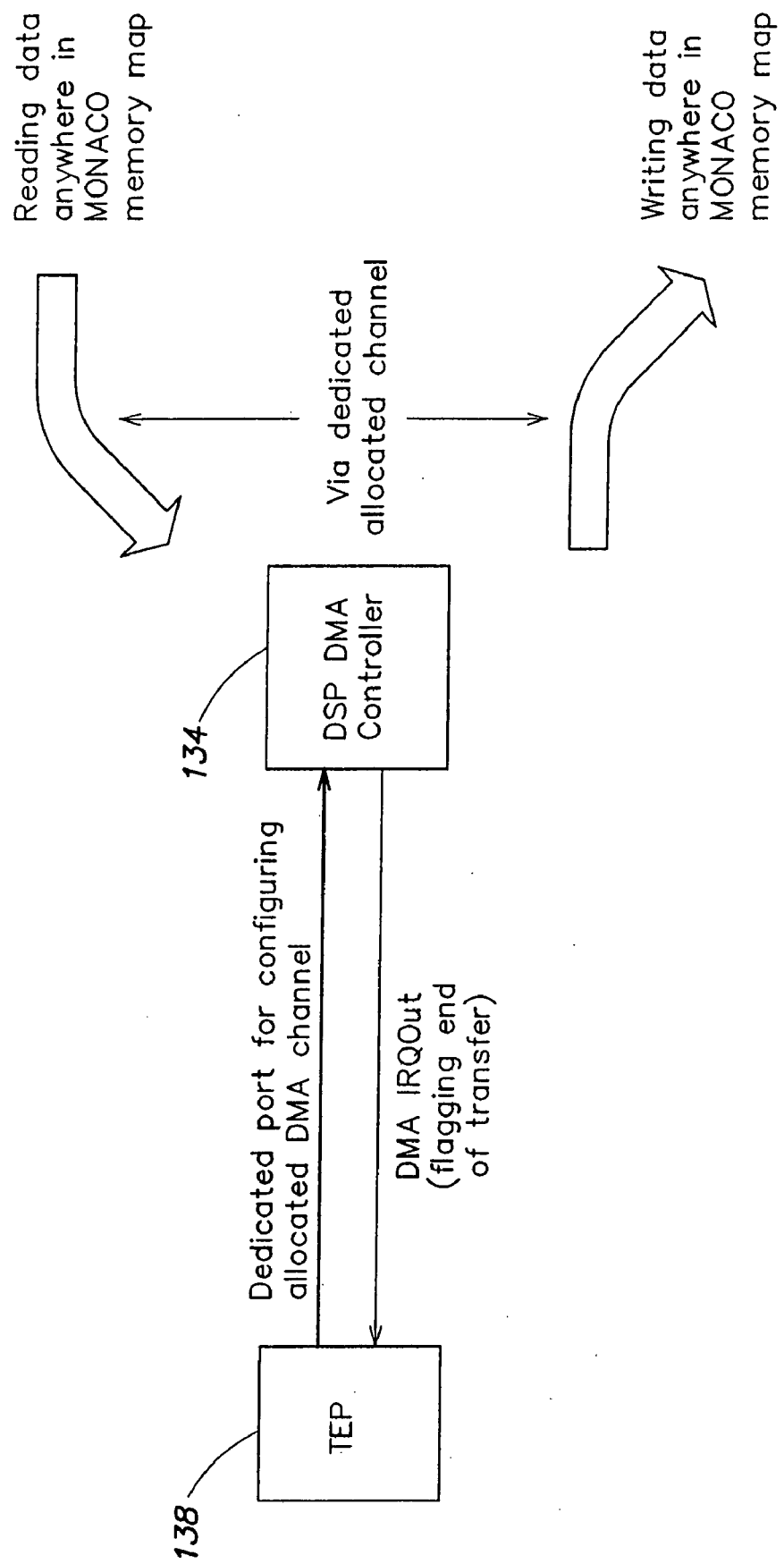
FIG. 7 is a block diagram that illustrates an example of a method for direct memory access transfers using the timing and event processor, according to one embodiment of the invention.

FIG. 7 shows schematically an example of a TEP initiated DMA transfer, as described above with reference to FIG. 6. First, TEP 138 sends channel configuration information to DMA controller 134 using the dedicated channel and sends a channel enable signal to DMA controller 134. DMA controller 134 carries out the data transfer and generates an interrupt to TEP 138 which indicates completion of the data transfer.

Clock calibration unit 212 shown in FIG. 2 is used to calibrate a slow clock of communications processor 100. Communications processor 100 may receive clock signals from a system clock at a frequency of, for example, 13 MHz and a free-running slow clock, for example, at a frequency of 32 kHz. While a high frequency clock, such as the system clock, may be necessary to clock the processing cores of communications processor 100, the slow clock may be used for timing control to conserve power when the processing cores are in an idle state and do not need to be clocked by the high frequency clock. TEP 138 may derive system timing from the slow clock. The timing events handled by TEP 138 are based on a time of the slow clock and a delta-time (counted in system clock cycles) relative to a time of the slow clock cycle. The system oscillator may be powered down when not needed by any of the modules of communications processor 100, and the slow clock may be relied upon to initiate power up of the system clock when it is required for the next scheduled operation. Power down of the system oscillator is discussed in greater detail below.

The slow clock is not as accurate as the high frequency system clock and is more sensitive to temperature fluctuations. Thus, the slow clock may be calibrated to ensure a desired degree of accuracy. The slow clock may calibrated using either the system clock or the timing of the wireless system received over the radio. If the system clock is used for calibration, the number of system clock cycles may be counted over a selected number of slow clock cycles. If timing from the wireless system is used for calibration, the number of wireless system clock cycles (received over the radio) may be counted over a selected number of slow clock cycles.

In order to conserve power that otherwise would be consumed by calibrating the slow clock using a frequency synthesizer or VCO, the slow clock may be calibrated by removing clock cycles from the free-running slow clock to provide a calibrated slow clock. That is, a frequency lower than the expected frequency of the free-running slow clock may be chosen as the calibrated clock frequency (e.g., 31 kHz in the case of a 32 kHz slow clock) and the calibrated clock signal may be generated by removing clock pulses from the free-running slow clock signal. The free-running slow clock may be adjusted by a fractional-N clock divider, which periodically removes a clock cycle from the free-running slow clock. The period in which a clock cycle is removed from the free-running slow clock depends on specified fraction and modulus values and on information obtained from comparing the slow clock to the system clock. For example, if the period in which clock cycles are removed is nine slow clock cycles, eight calibrated slow clock cycles are generated for every nine uncalibrated slow clock cycles.

However, removing clock cycles from the free-running slow clock introduces phase errors into the calibrated slow clock. Such phase errors are caused by the fact that the calibrated slow clock is not truly periodic. For example, assume that a calibrated slow clock of 40 kHz is generated from a free-running 50 kHz clock. The 50 kHz clock has a rising edge every 20 μsec. That is, the 50 kHz clock has rising edges at 20 μsec, 40 μsec, 60 μsec, 80 μsec, 100 μsec, 120 μsec, etc. The 40 kHz calibrated slow clock may be generated by periodically removing a cycle. Thus, the calibrated slow clock will have rising edges at 20 μsec, 40 μsec, 60 μsec, 100 μsec, 120 μsec, etc. The calibrated slow clock averages out to a 40 kHz clock, that is, 40,000 leading clock edges per second, but is out of phase with respect to a true 40 kHz clock. A true 40 kHz clock would have a rising clock edge every 25 μsec. For example, a true 40 kHz clock would have rising clock edges at 25 μsec, 50 μsec, 75 μsec, 100 μsec, 125 μsec, etc. Thus, the rising edges in the calibrated 40 KHz clock and the rising edges in the true 40 KHz clock occur at different times and phase compensation is used to account for the difference in phase between the calibrated slow clock and a true clock of the same frequency, as discussed below.

Figure 9A:
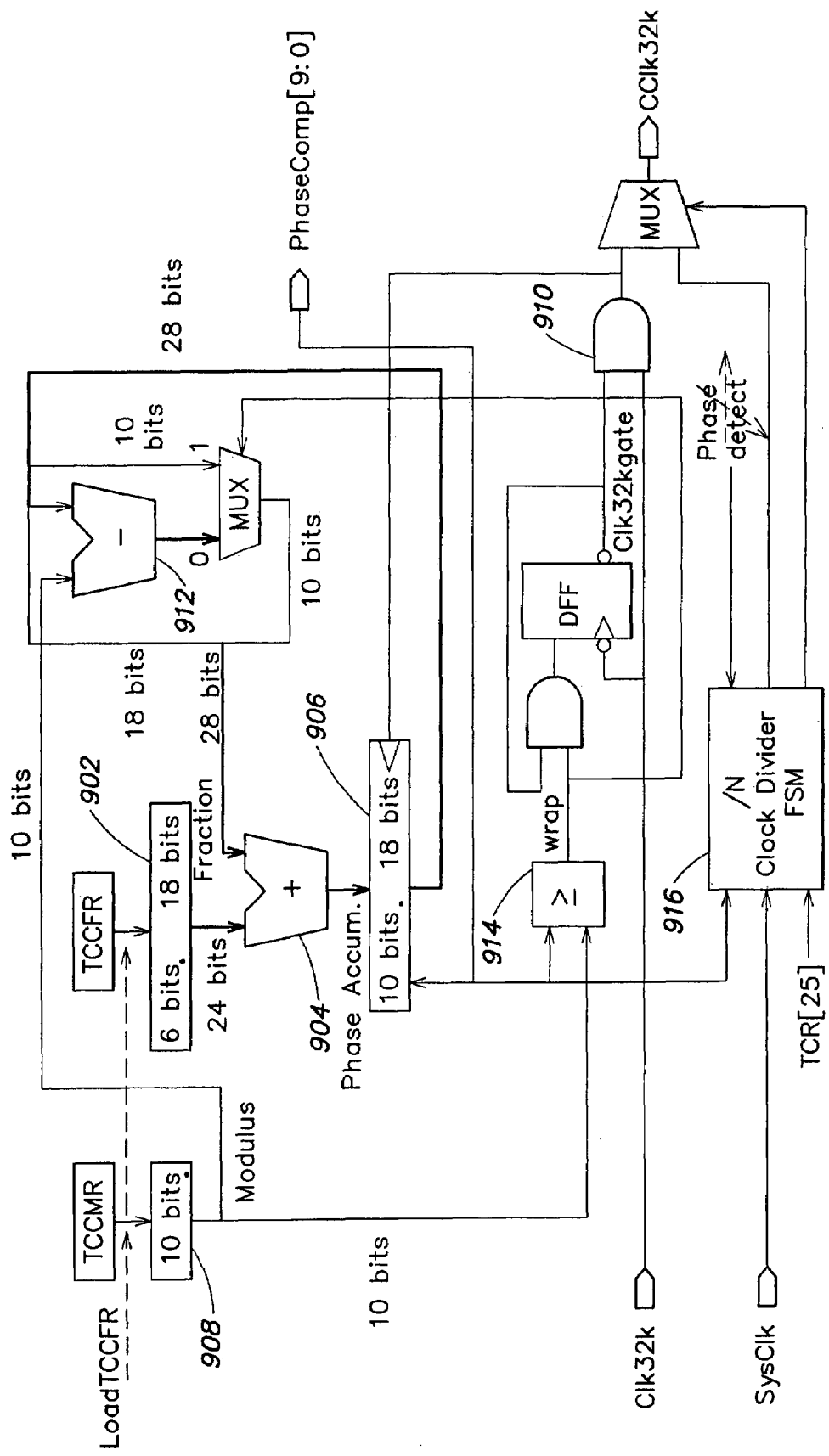
FIG. 9A is a block diagram of an example of a fractional-N clock divider, according to one embodiment of the invention.
Figure 9B:
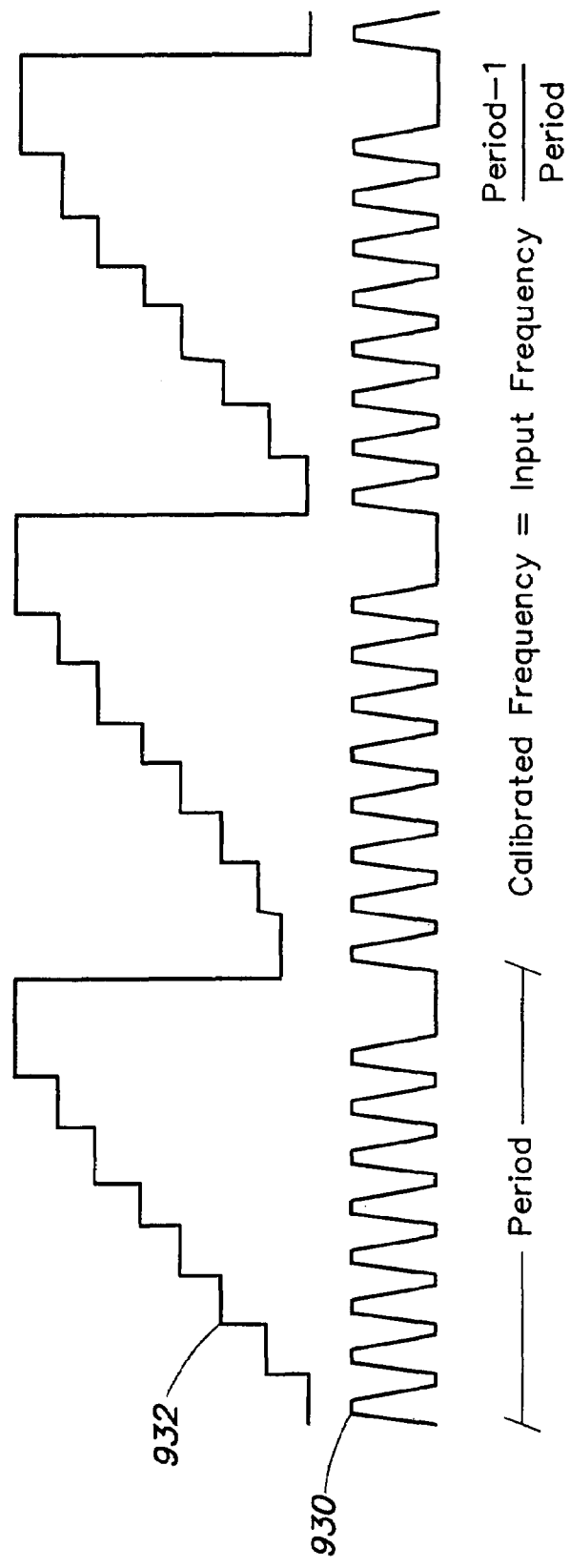
FIG. 9B is a schematic diagram showing a calibrated clock and phase compensation generated by the fractional-N clock divider, according to one embodiment of the invention.

FIGS. 9A and 9B show an implementation of a fractional-N clock divider with phase compensation and a timing diagram illustrating phase compensation, respectively, according to an embodiment of the invention. A fractional increment register 902 stores the ratio of fast clock cycles to free-running 32 kHz clock cycles and serves as one input to an adder 904. A phase compensation register 906 is an accumulator which accumulates the output of adder 904 and serves as one input to a modulus operator 912. A modulus register 908 stores a value that is compared by a comparator 914 with the upper 10 bits in the phase compensation register 906. The comparator 914 serves as an input to an AND gate 910 and controls whether the free-running 32 kHz clock passes through gate 910. Modulus register 908 is a second input to modulus operator 912. The modulus operator 912 calculates a modulus value that is used to increment the phase compensation register 906 when the comparator is set.

In operation, when the value in register 906 reaches the value in modulus register 908, the output of comparator 914 is set, thus inhibiting the output of gate 910. As can be seen, the amount of phase compensation (i.e., the value of register 906) is accumulated and increases linearly each free-running 32 kHz clock cycle. When the accumulator reaches the modulus register 908, the free-running 32 kHz clock input is gated off until the next clock cycle. Then the phase compensation accumulator is wrapped around via the calculated modulus value from the modulus operator 912.

As mentioned above, removing clock pulses introduces phase errors into the calibrated clock signal. The phase errors result from the fact that the calibrated slow clock 930 with pulses removed, shown in FIG. 9B, has clock edges occurring at different times from a free-running clock of the same frequency. As indicated by waveform 932 in FIG. 9B, the phase error increases with each slow clock cycle until a pulse is removed and then returns to zero. In the absence of phase compensation, these phase errors would produce timing errors in the wireless systems. By utilizing the calibrated slow clock and a phase compensation signal which represents the phase error, precise timing is achieved with the calibrated slow clock.

Thus, when the calibrated clock signal is used to drive absolute counter 214, the phase errors in the calibrated clock signal are compensated for by using the phase compensation calculated in phase compensation register 906. Referring to the example discussed above using a 50 kHz free-running slow clock and a 40 kHz calibrated slow clock, assume an event is scheduled to occur on the third rising edge of the 40 kHz clock signal. As discussed above, in a true 40 kHz clock, the third rising edge occurs at 75 μsec. However, in the calibrated 40 kHz clock, the third rising edge occurs at 60 μsec. Thus, the calibrated slow clock is out of phase with the true 40 KHz clock by 15 μsec. When the calibrated slow clock reaches the third rising edge at 60 μsec, a further delay of 15 μsec, counted in system clock cycles, is added before execution of the scheduled event. In this manner, the sequencers compensate for the adjusted frequency of the calibrated clock signal.

Sometimes sufficient frequency stability of the slow clock cannot be achieved due to, for example, rapid temperature fluctuations. However, it may still be necessary to generate a calibrated slow clock signal for driving the absolute counter and timing the execution of LongWait instructions. In such situations, frequency division of the system clock may be used. For example, a clock divider FSM 916 may divide the system clock down to a calibrated slow clock.

Figure 10:
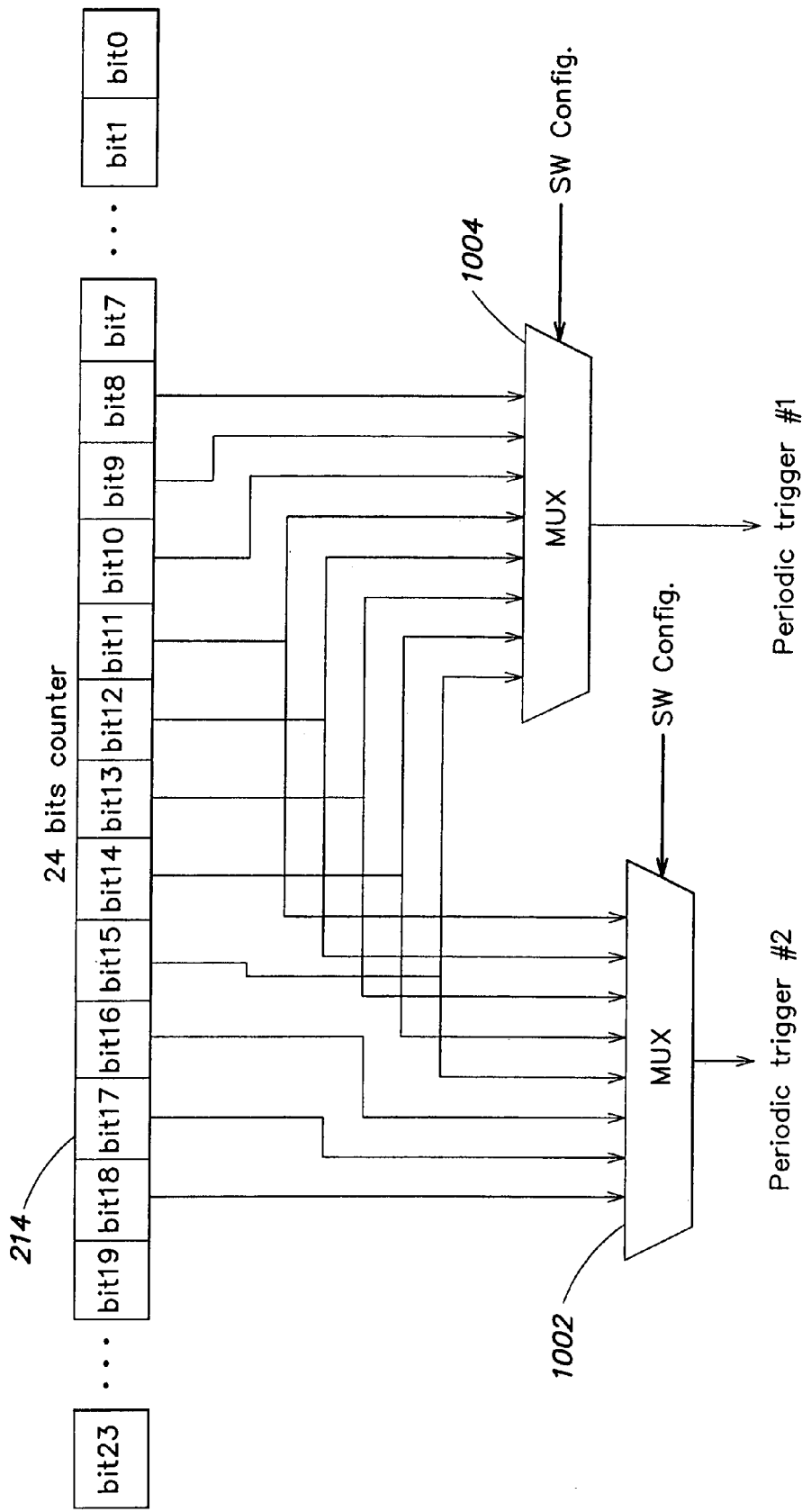
FIG. 10 is a block diagram of an absolute counter and configurable periodic trigger generators, according to one embodiment of the invention.

Absolute counter 214, shown in FIG. 2, may be clocked by the calibrated slow clock. Absolute counter 214 is shown in more detail in FIG. 10. In one embodiment, absolute counter 214 may be a 24-bit counter and may be used by the sequencers 202a-202n when executing a LongWait instruction to determine when the wait period has expired. For example, sequencers 202a-202n may compare the value of absolute counter 214 to the wait period of the LongWait instruction to determine when the wait period has expired.

Two periodic trigger generators 1002 and 1004 are supplied and may be used for various purposes, such as triggering interrupts or triggering a snapshot. A snapshot is a measurement of the slow clock against the system clock or a measurement of the slow clock against the timing of the wireless system received over the radio, which may be used for calibration of the slow clock. A snapshot involves counting the number of system clock cycles in a given number of slow clock cycles.

Figure 11A:
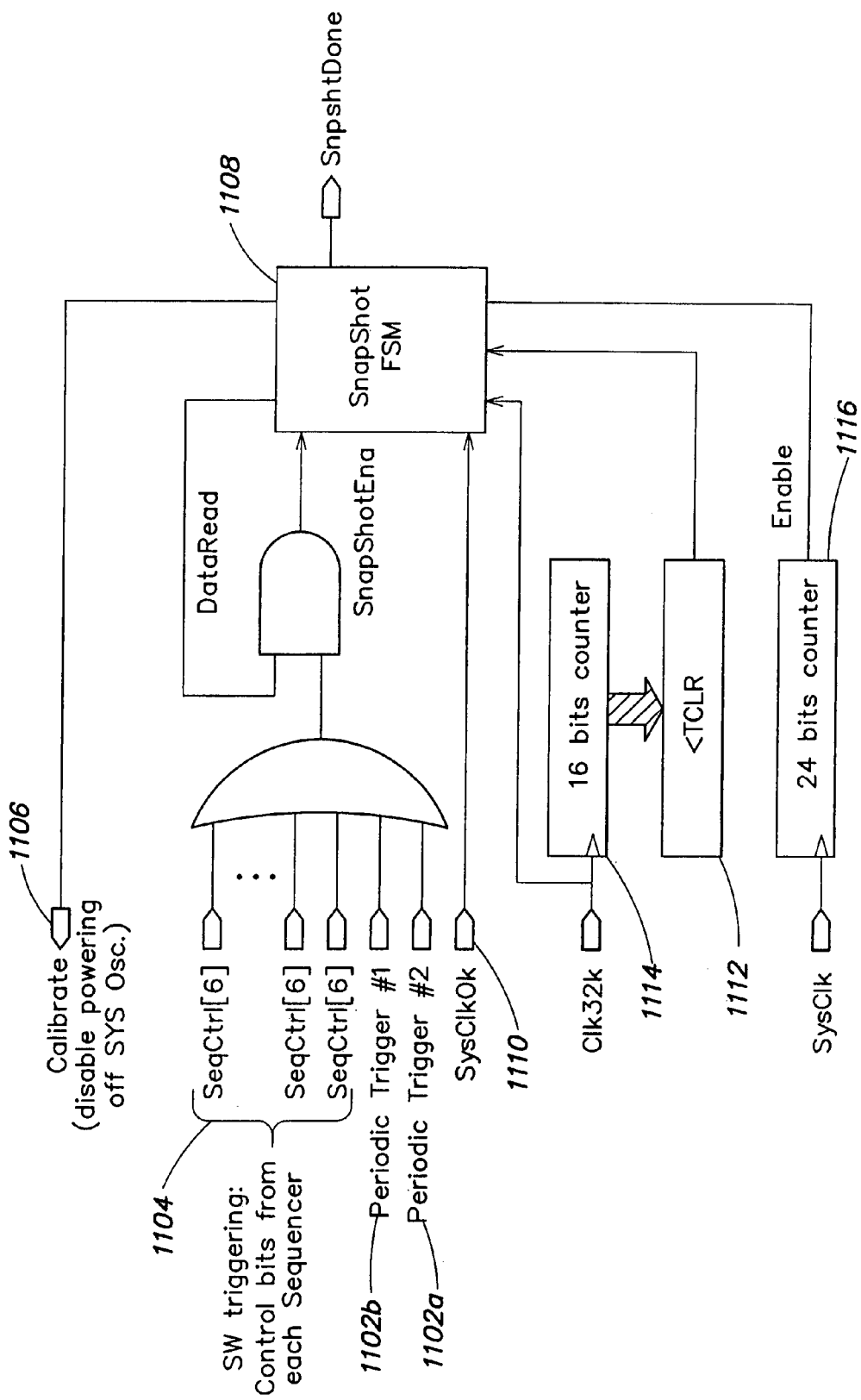
FIG. 11A is a block diagram of a snapshot finite state machine, according to one embodiment of the invention.
Figure 11B:
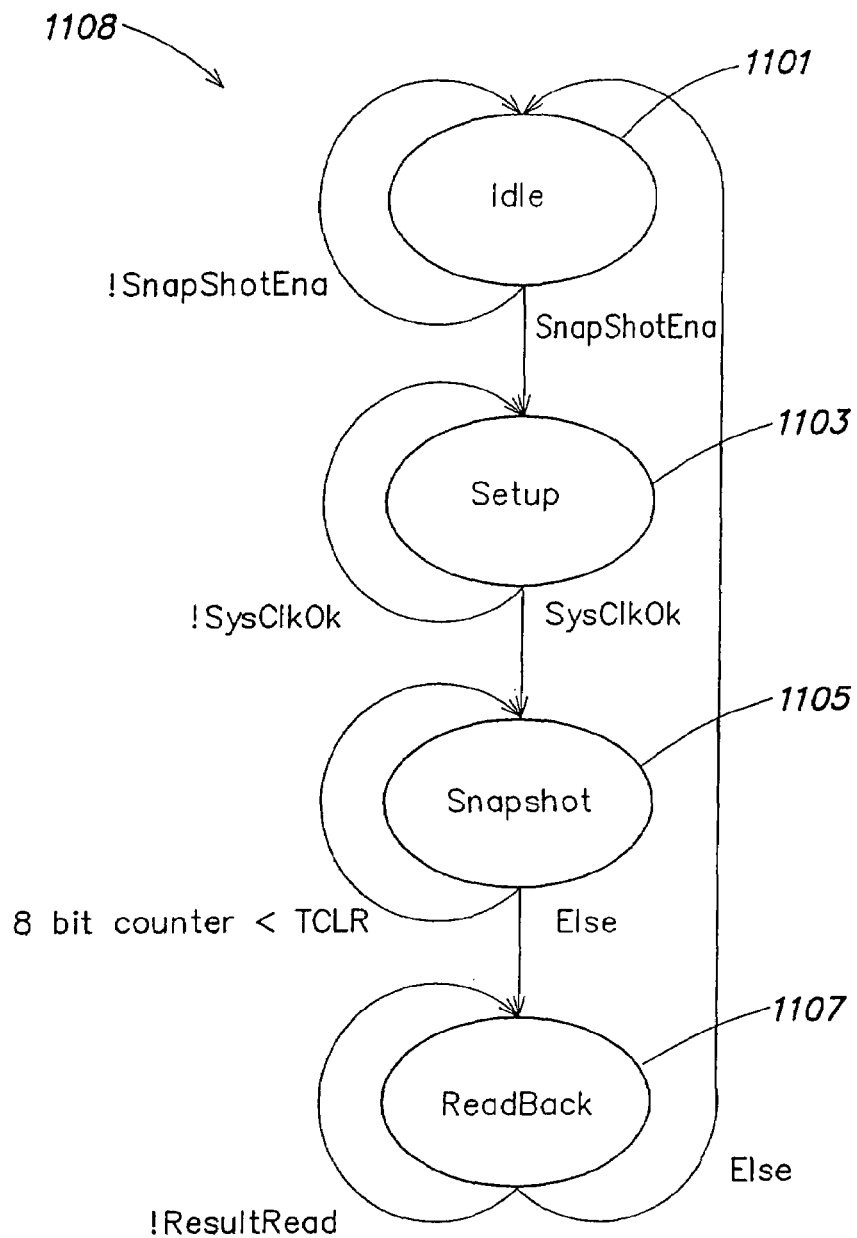
FIG. 11B is a flow chart of the operation of the snapshot finite state machine of FIG. 11A, according to one embodiment of the invention.

FIGS. 11A and 11B show a block diagram and a state transition diagram, respectively, for obtaining a snapshot. A snapshot may be initiated by several different inputs. For example, a snapshot may be initiated by either of the two periodic triggers of the absolute counter or may be initiated by software running on either of the two processing cores, based on setting bits in the SeqCtrl register 312 (FIG. 3) in any of the sequencers' register files.

When a snapshot is initiated, a calibrate signal is asserted to prevent powering down of the system clock. Next, a snapshot FSM 1108 enters a setup state 1103 in which it waits to receive a SysClkOk signal 1110, indicating that the system clock oscillator is not powered off. When the SysClkOk signal 1110 is received, snapshot FSM 1108 enters a snapshot state 1105 in which the number of system clock cycles is counted during a number of slow clock cycles. The number of slow clock cycles is specified in a TCLR register 1112, which is software configurable. After the number of clock cycles specified in TCLR register 1112 has been counted by a slow clock cycle counter 1114, an interrupt is generated and snapshot FSM 1108 enters readback state 1107. While snapshot 1108 is in readback state 1107, a system clock cycle counter 1116 is readable by the processing cores via the DPBUS bus interface 210 to update any registers needed for calibration of the slow clock. After counter 1116 is read, snapshot FSM 1108 returns to idle state 1101.

Clock and Power Control Module 216 is shown in FIG. 2. When certain modules of TEP 138 are not in use, clock signals to these modules may be gated off to conserve power. If one or more sequencers are executing LongWait instructions and no other modules require use of the system clock, the Clock and Power Control Module 216 may determine if the duration of the LongWait instruction is sufficient to permit the system clock to be powered down.

Figure 12A:
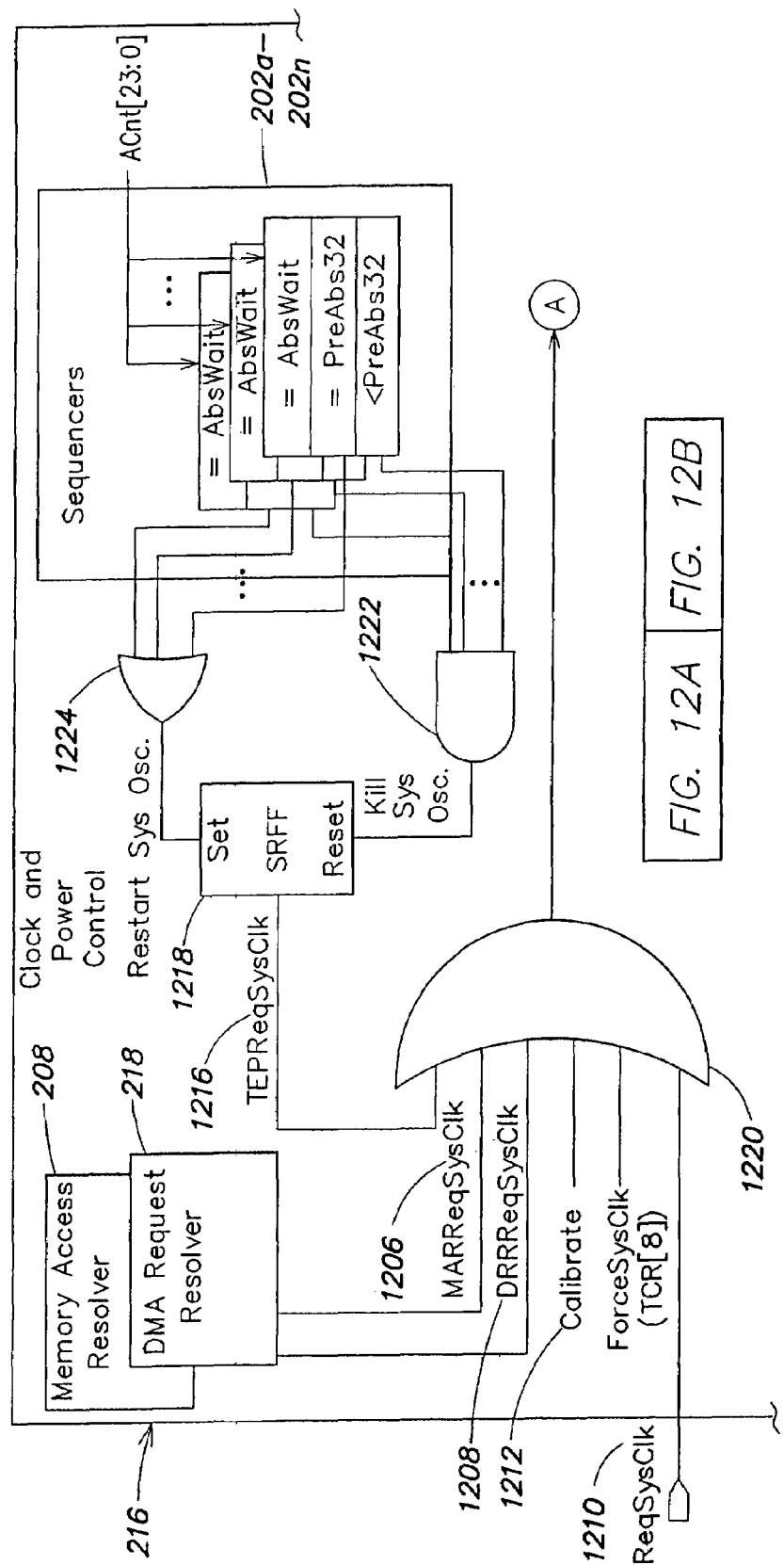
FIG. 12 is a block diagram of a clock and power control module in the timing and event processor of FIG. 2, according to one embodiment of the invention.
Figure 12B:
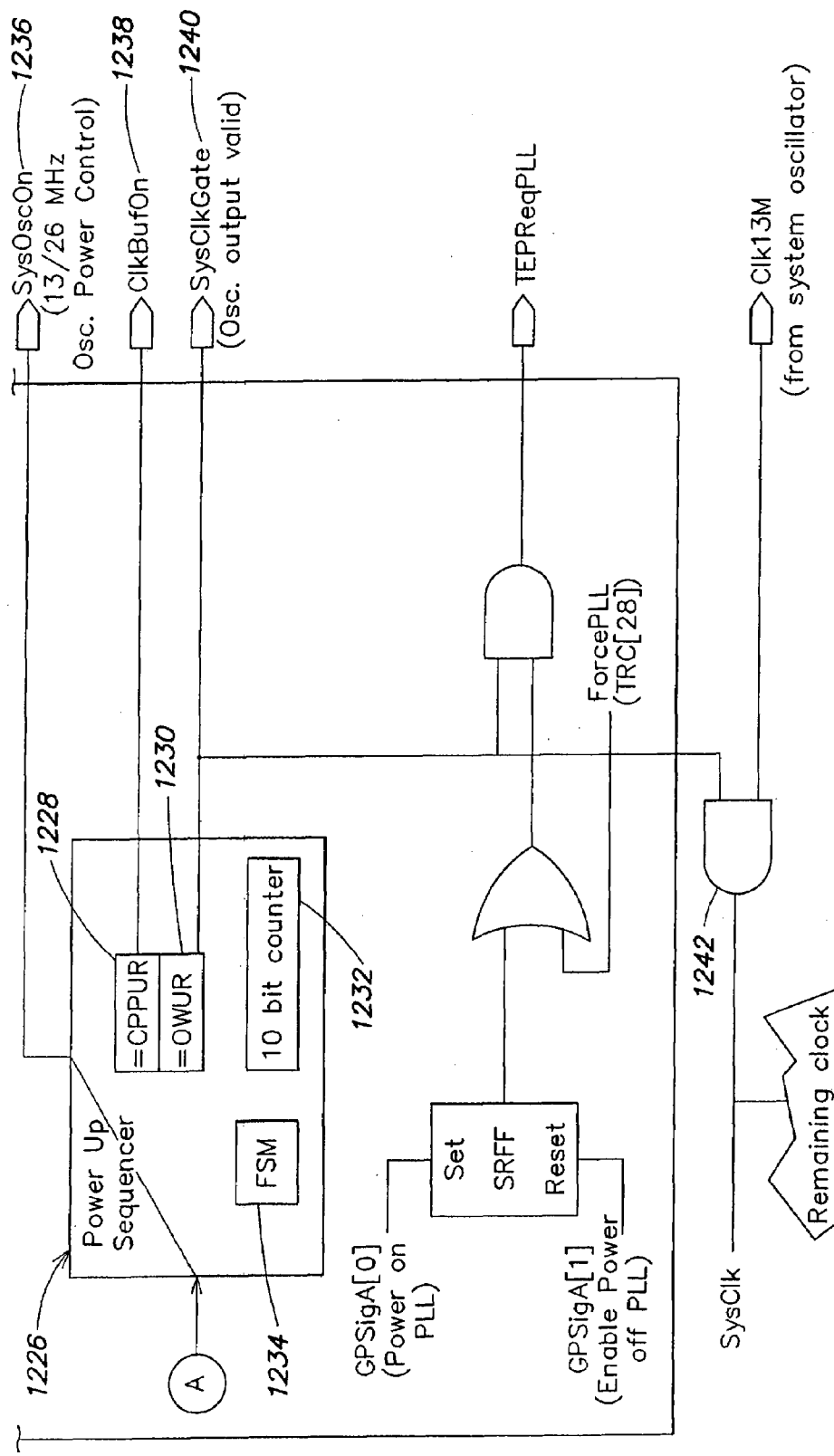

FIG. 12 is a block diagram of Clock and Power Control Module 216. Several TEP modules, such as memory access resolver 208 and DMA request resolver 218, may require use of the system clock and may indicate to Clock and Power Control Module 216 via signals 1206 and 1208, respectively, that the system clock is needed. An external signal, ReqSysClk 1210, may be provided by an external source to indicate that one or more modules external to the TEP require use of the system clock. The determination of when to provide the ReqSysClk signal is discussed in greater detail below. Calibrate signal 1212 is asserted by the clock calibration module when performing calibration of the slow clock, and requests that the system clock remain active.

Each sequencer 202a-202n may indicate to Clock and Power Control module 216 through Set-Reset Flip Flop (SRFF) 1218 that the system clock is required. The Q output of SRFF 1218 is TEPReqSysClk signal 1216. Each sequencer that does not require the system clock asserts a KillSysOsc signal through an AND gate 1222. When none of the sequencers requires the system clock, SRFF 1218 enters the reset state and signal 1216 is not asserted. If any sequencer requires use of the system clock, it asserts a Restart System Oscillator signal through an OR gate 1224. In response, SRFF 1218 enters the set state, and signal 1216 is asserted. The PreAbs 32 register 338 may be used to store the latest time at which the oscillator may remain powered down, taking into account the scheduled execution time of the next instruction and the necessary warm-up time of the oscillator. A sequencer may assert a KillSysOsc signal if the current time is less than the time in its PreAbs32 register 338. If the current time is equal to the time in its PreAbs32 register 338, then a sequencer may assert a RestartSysOsc signal. When the current time equals the expire time of the LongWait instruction, the system clock should be stabilized.

A power-up sequencer 1226 receives from OR gate 1220 an input signal which indicates if any module, internal or external to the TEP, requires use of the system clock. If this signal is asserted, power-up sequencer 1226 may power up the system clock oscillator by asserting SysOscOn signal 1236. A clock pad power up register (CPPUR) 1228 stores the settling time for the clock pad buffer, and an oscillator warm-up register OWUR 1230 stores the warm-up time for the oscillator. When the input signal to power-up sequencer 1226 from OR gate 1220 is asserted, an FSM 1234 starts a 10-bit counter 1232 from zero and asserts the SysOscOn signal 1236, causing the system oscillator to be powered up. When the counter 1232 reaches the time specified in OWUR 1230, a ClkBufOn signal 1238 is asserted, enabling a clock pad buffer. When the counter 1232 equals the time specified in OWUR 1230 plus the time specified in CCPUR 1228, a SysClkGate signal 1240 is asserted, indicating that the system clock oscillator output is valid and enabling an AND gate 1242. The AND gate 1242 inhibits the system clock oscillator output until the oscillator has had sufficient time to stabilize.

The oscillator is stable after the oscillator warm-up time specified in OWUR 1230 plus the clock pad power up delay time stored in CPPUR 1228 is reached. When this time is reached, SysClkGate signal 1240 enables AND gate 1242, and clock signals from the oscillator are allowed to pass through the gate.

Figure 13A:
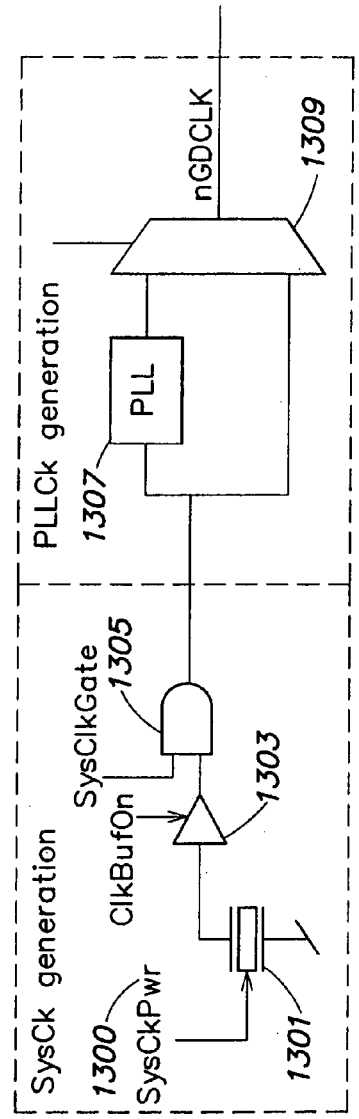
FIG. 13A is a schematic diagram of a clock generation module, according to one embodiment of the invention.

As mentioned above, clock and power control module 216 receives a ReqSysClk signal from a source external to the TEP 138. This signal indicates whether any modules external to the TEP 138, such as DSP core 102 and MCU 104, require use of the system oscillator. FIG. 13A shows how clock signals may be generated in communications processor 100. A power source 1300 powers a system oscillator 1301. The power source may be controlled as described above by a SysOscOn signal received from the TEP. This signal may be used to control whether the oscillator 1301 is powered on or off. The oscillator output is input to a pad buffer amplifier 1303. The buffer amplifier 1303 may be powered on and off via a control signal from the TEP. The clock signal output from buffer amplifier 1303 is input to AND gate 1305. The second input to gate 1305 is a SysClkGate signal received from the TEP 138, which allows oscillator output to be gated off during a warm-up time of the oscillator.

Figure 13B:
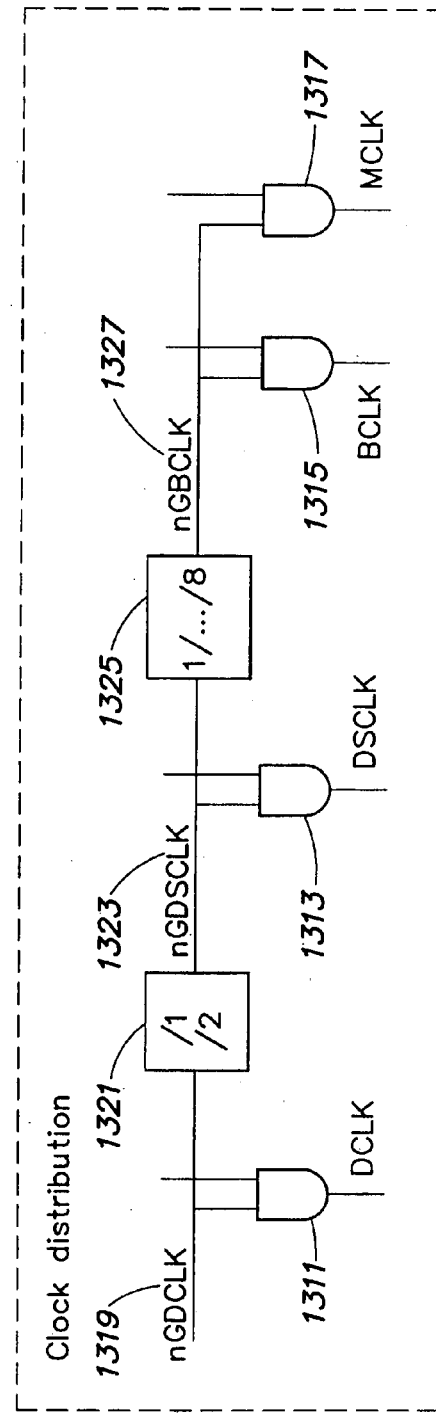
FIG. 13B is a schematic diagram of a clock distribution module, according to one embodiment of the invention.

Clock signals output from gate 1305 are input to a phase-locked loop (PLL) 1307 which multiplies the clock signal to a frequency suitable for clocking the DSP core 102. In situations where the DSP core is idle, it may not be necessary to multiply the clock signal using PLL 1307 and the clock signal output from gate 1305 is not supplied to PLL 1307. Multiplexer 1309 selects either the multiplied clock signal from PLL 1307 or the output of gate 1305. As shown in FIG. 13B, several clock signals may be generated from the output of multiplexer 1309. First, a DCLK clock may be generated as the output of PLL 1307. The DCLK clock may be used to clock the DSP core 102. A not-gated DCLK (nGDCLK) clock 1319 may be input to an AND gate 1311. The DCLK clock can be gated off when not needed by the DSP core using AND gate 1311. Next, a DSCLK clock may be generated by using a frequency divider 1321 to divide the DCLK clock. Frequency divider 1321 may be software programmable and may divide the DCLK clock by 1 or 2. The DSCLK clock may be used to clock the DSP subsystem, which includes the DSP peripherals and DSP DMA controller 134. The DSCLK clock may be gated off by AND gate 1313 when not needed. The not-gated DSCLK (nGDSCLK) clock 1323 may be supplied to a programmable clock divider 1325, which may divide its input signal by a number between 1 and 8 to generate a BCLK clock. The BCLK clock may be used to drive the buses of communications processor 100. The BCLK clock may be gated off when not needed by an AND gate 1315. An MCLK clock may be of the same frequency as the BCLK clock and may be used to clock the MCU 104. The MCLK clock may be gated off by AND gate 1317 when not needed.

Figure 14A:
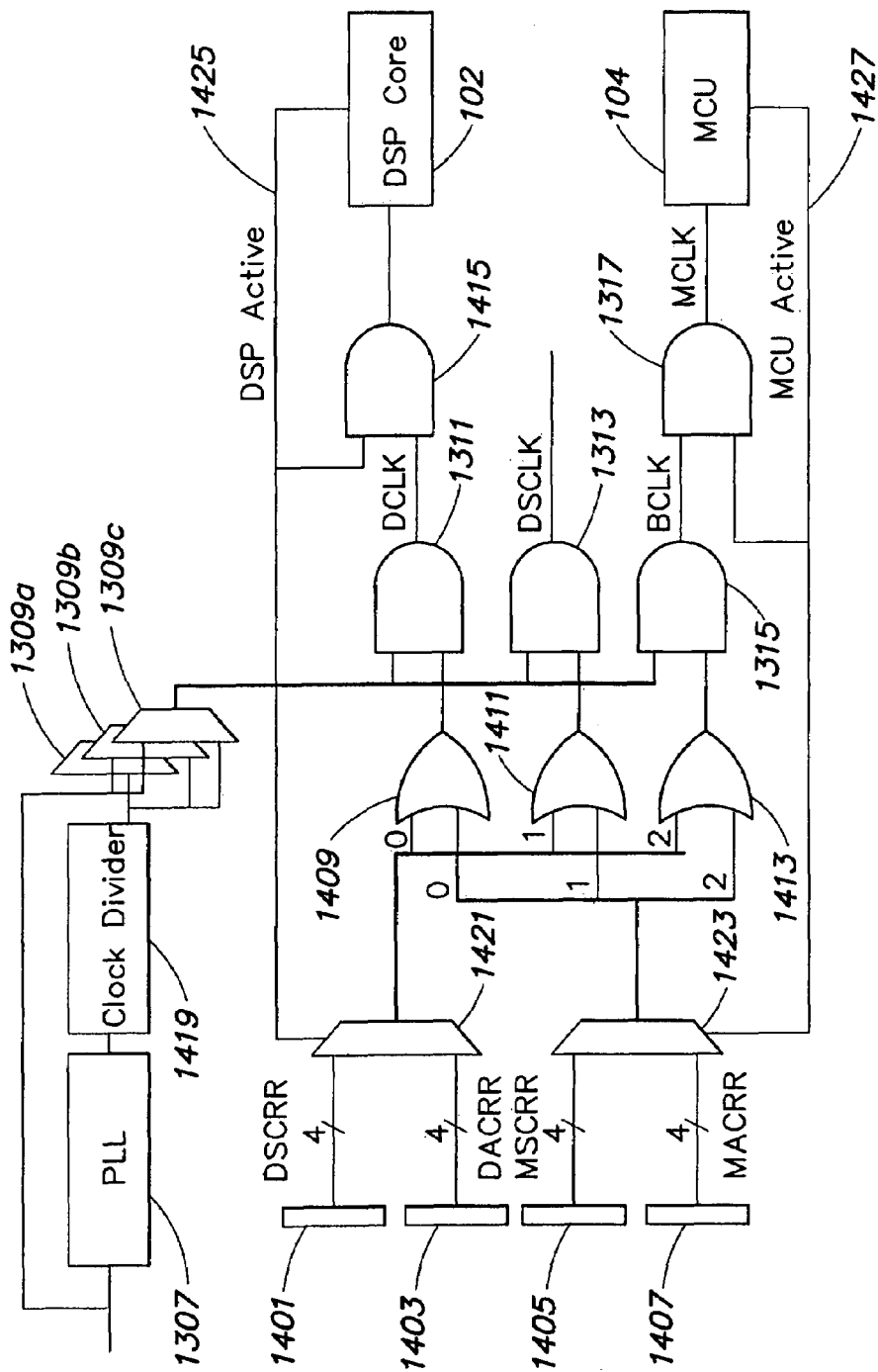
FIG. 14A is a schematic diagram of a clock gating module, according to one embodiment of the invention.

FIGS. 14A and 14B illustrate how the clock signals of FIG. 13B may be gated off when not needed. As shown in FIG. 14A, PLL 1307 multiplies the oscillator output to generate a clock signal. Clock divider 1419 may perform the same operations as clock dividers 1321 and 1325 of FIG. 13B. The clock signals output from clock divider 1419 may be the ngDCLK signal, the nGDSCLK signal, and the nGDBCLK signal. Each of these clock signals is then directed to one of the multiplexers 1309a-1309c and then to the appropriate AND gate 1311-1315.

Register 1405 is an MCU sleep clock requirements register (MSCRR). MSCRR register 1405, as illustrated in FIG. 14B, indicates which clocks are required while the MCU is sleeping, or in idle mode. Similarly, an MCU active clock requirements register (MACRR) register 1407 stores information regarding which clocks are required while the MCU is active. An MCU Active signal 1427 generated by MCU 104 is used by a multiplexer 1423 to determine whether to output the contents of MSCRR register 1405 or MACRR register 1407. A PLL bypass bit in MSCRR register 1405, when set, allows PLL 1307 to be bypassed while the MCU 104 is sleeping. Because MCU 104 may not need to be clocked while in idle mode, it may not be necessary for PLL 1307 to multiply the oscillator to a high frequency to drive MCU 104. Thus, a power savings can be achieved by bypassing PLL 1307. Also, in some cases where high processing speed is not required, the DSP core 102 and MCU 104 may run on the system clock input to the communications processor without PLL multiplication.

Similar to MCU 104, two DSP registers are provided: a DSP sleep clock requirements register (DSCRR) 1401 and a DSP active clock requirement register (DACRR) 1403. Registers 1401 and 1403 indicate which clocks are needed while the DSP core 102 is sleeping and which clocks are needed when DSP core 102 is active, respectively. A DSP Active signal generated by DSP core 102 is used by a multiplexer 1421 to determine whether to output the contents of DSCRR register 1401 or DACRR register 1403. OR-gates 1409, 1411, and 1413 combine the outputs of the MCU requirement registers 1405 and 1407 and the DSP requirement registers 1401 and 1403. AND gates 1415, 1311, 1313, 1315, and 1317 may be used to enable or inhibit the corresponding clock signals according to the contents of registers 1401, 1403, 1405 and 1407.

Figure 15:
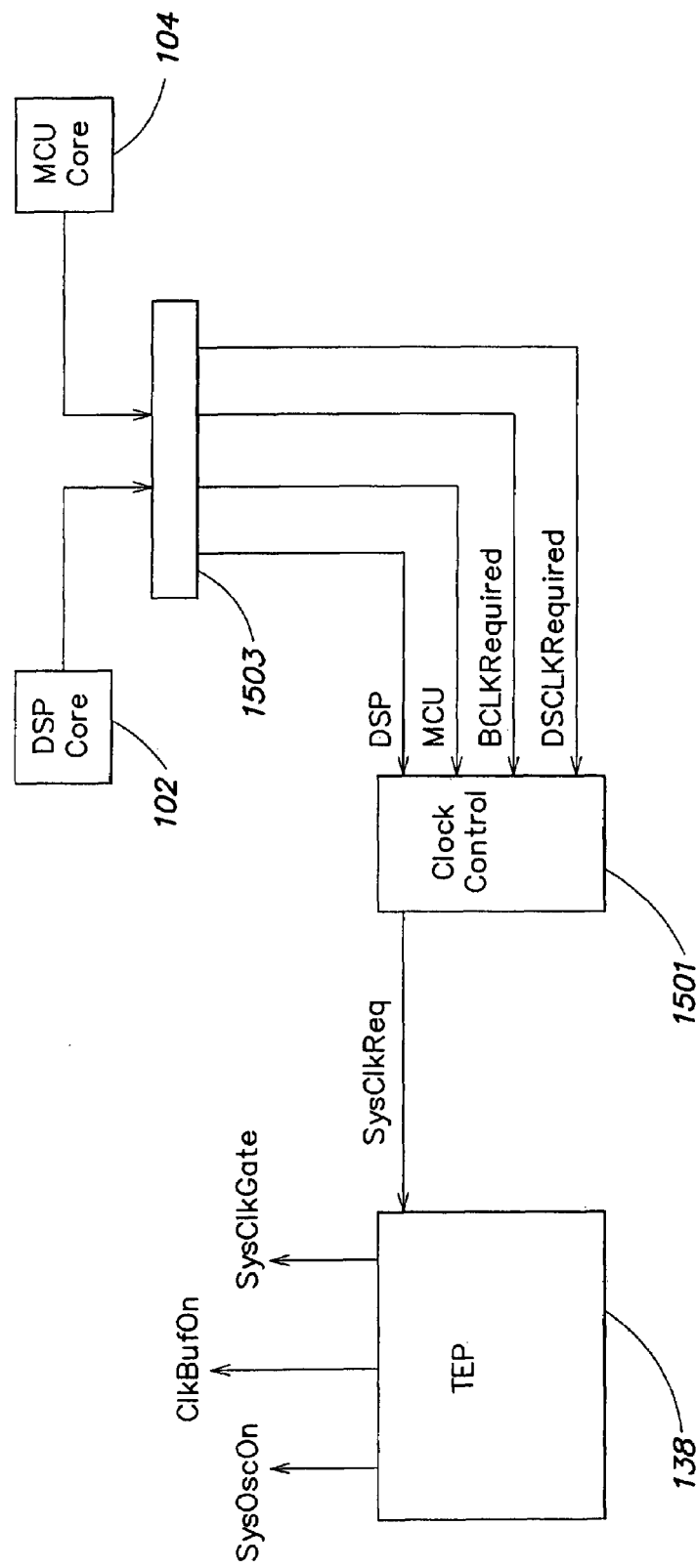
FIG. 15 is a block diagram that illustrates oscillator power-down requirements, according to one embodiment of the invention.

In addition to inhibiting certain clock signals when they are not needed to save power, the system clock oscillator may be powered down, so that no system clock signals are generated when no modules of communications processor 100 require a clock. FIG. 15 illustrates how the oscillator may be powered down. DSP core 102 and MCU core 104 update a register 1503 indicating whether the respective processing cores require clock signals and whether any peripherals require clock signals. Clock control module 1501 monitors register 1503 to determine if any of the clock signals are required by any modules in communications processor 100. If none of these clock signals are required, clock control module 1501 may provide a SysClkReq signal to TEP 138. As discussed above with reference to FIG. 12, TEP 138 may then make a determination as to whether the system oscillator may be powered down. In this manner, the system oscillator may be powered up when needed and powered down when not needed in order to conserve power.

Having thus described various embodiments of the invention, numerous improvements and modifications will occur to one skilled in the art. Thus, it is not intended that the breadth of the invention be limited to the specific embodiments illustrated and described. Rather, the scope of the invention is to be limited only by the appended claims and their equivalents.

The invention claimed is:

1. A digital baseband processor comprising:
   at least one main processor for executing instructions in a first instruction sequence; and
   a timing and event processor coupled to said main processor for executing timing-sensitive instructions in a second instruction sequence, said timing and event processor comprising:
   two or more instruction sequencers for executing threads of the second instruction sequence; and
   a time base generator for generating timing signals for initiating execution of instructions on each of the two or more instruction sequencers, wherein said time base generator is configured to use a unified time base derived from a plurality of time bases.

2. A digital baseband processor as defined in claim 1, wherein said timing and event processor includes means for initiating time precise DMA transfers between components of the digital baseband processor.

3. A digital baseband processor as defined in claim 1, wherein said timing and event processor includes means for time precise enabling of a DMA channel in the digital baseband processor.

4. A digital baseband processor as defined in claim 1, wherein said timing and event processor includes means for generating a time precise interrupt to said main processor.

5. A digital baseband processor as defined in claim 1, wherein said timing and event processor includes means for generating a time precise trigger to another component of the digital baseband processor.

6. A digital baseband processor as defined in claim 1, wherein said timing and event processor includes means for generating time precise output signals.

7. A digital baseband processor as defined in claim 1, wherein said timing and event processor includes means for calibrating a low frequency clock with respect to a high frequency clock and generating a calibrated low frequency clock and a phase compensation signal.

8. A digital baseband processor as defined in claim 1, wherein said timing and event processor includes a power control circuit responsive to the time base generator for gating off the clock to modules in the digital baseband processor that are idle.

9. A digital baseband processor as defined in claim 1, wherein said timing and event processor further includes a memory for holding instructions and data for said two or more instruction sequencers.

10. A digital baseband processor as defined in claim 9, wherein said memory is multi-ported and wherein said timing and event processor further includes a memory access resolver for controlling access to the memory by said two or more instruction sequencers.

11. A digital baseband processor as defined in claim 1, wherein said timing and event processor further comprises an I/O conflict resolver for resolving conflicts in outputs produced by said two or more instruction sequencers and for generating an exception in response to a conflict.

12. A digital baseband processor as defined in claim 1, further comprising a DMA controller for processing DMA requests, wherein said timing and event processor includes a DMA interface for initiating time precise DMA transfers.

13. A digital baseband processor as defined in claim 12, wherein said timing and event processor further includes a DMA request resolver for resolving conflicts among DMA requests produced by said two or more instruction sequencers.

14. A digital baseband processor as defined in claim 1, wherein said timing and event processor further comprises a bus interface for coupling said two or more instruction sequencers to a processor bus.

15. A digital baseband processor as defined in claim 1, wherein said time base generator includes a clock calibration circuit for calibrating a relatively unstable low frequency clock with respect to a relatively stable high frequency clock and producing a calibrated low frequency clock.

16. A digital baseband processor as defined in claim 15, wherein said timing and event processor further comprises an absolute counter for counting the calibrated low frequency clock and producing programmable timing signals.

17. A method for operating a digital baseband processor, comprising:
    providing a digital baseband processor including a main processor and a timing and event processor coupled to the main processor, the timing and event processor including two or more instruction sequencers and a time base generator configured to use a unified time base derived from a plurality of time bases;
    executing instructions of a first instruction sequence in the main processor; and
    executing timing-sensitive instructions of a second instruction sequence in the timing and event processor, including executing threads of the second instruction sequence in the two or more instruction sequencers and generating timing signals in the time base generator for initiating execution of instructions on each of the two or more instruction sequencers.

18. A method as defined in claim 17, wherein executing timing-sensitive instructions includes initiating time precise DMA transfers between components of the digital baseband processor.

19. A method as defined in claim 17, wherein executing timing-sensitive instructions includes time precise enabling of a DMA channel in the digital baseband processor.

20. A method as defined in claim 17, wherein executing timing-sensitive instructions includes generating a time precise interrupt to the main processor.

21. A method as defined in claim 17, wherein executing timing-sensitive instructions includes generating a time precise trigger to another component of the digital baseband processor.

22. A method as defined in claim 17, wherein executing timing-sensitive instructions includes generating time precise output signals.

* * * * *